(12) United States Patent
Yang et al.

(10) Patent No.: US 12,107,135 B2
(45) Date of Patent: Oct. 1, 2024

(54) SEMICONDUCTOR DEVICE

(71) Applicant: Samsung Electronics Co., Ltd., Suwon-si (KR)

(72) Inventors: Jung Gil Yang, Suwon-si (KR); Seung Min Song, Suwon-si (KR); Soo Jin Jeong, Suwon-si (KR); Dong Il Bae, Seongnam-si (KR); Bong Seok Suh, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 516 days.

(21) Appl. No.: 17/467,660

(22) Filed: Sep. 7, 2021

(65) Prior Publication Data

US 2021/0399108 A1 Dec. 23, 2021

Related U.S. Application Data

(63) Continuation of application No. 16/732,520, filed on Jan. 2, 2020, now Pat. No. 11,139,382.

(30) Foreign Application Priority Data

May 22, 2019 (KR) ........................ 10-2019-0059798

(51) Int. Cl.
*H01L 29/423* (2006.01)
*H01L 27/088* (2006.01)
(Continued)

(52) U.S. Cl.
CPC .... *H01L 29/42392* (2013.01); *H01L 27/0886* (2013.01); *H01L 27/0924* (2013.01);
(Continued)

(58) Field of Classification Search
CPC ........... H01L 29/42392; H01L 29/0642; H01L 29/4983; H01L 29/51; H01L 29/785;
(Continued)

(56) References Cited

U.S. PATENT DOCUMENTS 7,402,483 B2   7/2008 Yun et al.
9,608,062 B1 * 3/2017 Tseng .................... H01L 29/785
(Continued)

FOREIGN PATENT DOCUMENTS

KR  10-2016-0115019 A   10/2016
KR  10-2017-0143370 A   12/2017

OTHER PUBLICATIONS

First Office Action issued Jan. 17, 2024 by the Korean Intellectual Property Office for corresponding Korean Application KR 10-2019-0059798.

*Primary Examiner* — Fernando L Toledo
*Assistant Examiner* — Marshall Mu-Nuo Hatfield
(74) *Attorney, Agent, or Firm* — Muir Patent Law, PLLC

(57) ABSTRACT

A semiconductor device having a gate-all-around structure includes a first fin pattern and a second fin pattern separated by a first trench and extending in a first direction, a first nanosheet on the first fin pattern, a second nanosheet on the second fin pattern, a first fin liner extending along at least a portion of a sidewall and a bottom surface of the first trench, a first field insulation layer disposed on the first fin liner and filling a portion of the first trench, and a first gate structure overlapping an end portion of the first fin pattern and including a first gate spacer. A height from the bottom surface of the first trench to a lower surface of the first gate spacer is greater than a height from the bottom surface of the first trench to an upper surface of the first field insulation layer.

18 Claims, 19 Drawing Sheets

(51) Int. Cl.
*H01L 27/092* (2006.01)
*H01L 27/12* (2006.01)
*H01L 29/06* (2006.01)
*H01L 29/49* (2006.01)
*H01L 29/51* (2006.01)
*H01L 29/78* (2006.01)
*H01L 29/786* (2006.01)

(52) U.S. Cl.
CPC ...... *H01L 27/1211* (2013.01); *H01L 29/0642* (2013.01); *H01L 29/4983* (2013.01); *H01L 29/51* (2013.01); *H01L 29/785* (2013.01); *H01L 29/7851* (2013.01); *H01L 29/78696* (2013.01)

(58) Field of Classification Search
CPC ........... H01L 29/7851; H01L 29/78696; H01L 29/7853–7854; H01L 27/0886; H01L 27/0924; H01L 27/1211; H01L 21/823431; H01L 21/823821; H01L 21/845; H10B 12/36; H10B 12/056
See application file for complete search history.

(56) References Cited

U.S. PATENT DOCUMENTS

| | | |
|---|---|---|
| 9,620,590 B1 | 4/2017 | Bergendahl et al. |
| 9,818,875 B1 | 11/2017 | Bi et al. |
| 9,847,391 B1 | 12/2017 | Zang et al. |
| 9,905,468 B2 | 2/2018 | Kim et al. |
| 9,947,804 B1* | 4/2018 | Frougier ............... H01L 29/165 |
| 9,972,701 B2 | 5/2018 | Kim et al. |
| 9,984,893 B2 | 5/2018 | Cheng et al. |
| 2015/0214341 A1 | 7/2015 | Shin et al. |
| 2016/0163604 A1 | 6/2016 | Xie et al. |
| 2017/0025540 A1 | 1/2017 | Liou et al. |
| 2017/0110554 A1* | 4/2017 | Tak ................... H01L 29/42392 |
| 2017/0141211 A1* | 5/2017 | Xie ................... H01L 21/76224 |
| 2017/0162574 A1* | 6/2017 | Kim ..................... H01L 29/0649 |
| 2017/0200738 A1 | 7/2017 | Kim et al. |
| 2017/0345825 A1* | 11/2017 | Park ................... H01L 29/0847 |
| 2018/0033699 A1 | 2/2018 | Zhu |
| 2018/0090493 A1 | 3/2018 | Kwak et al. |
| 2018/0108771 A1* | 4/2018 | Bi ...................... H01L 29/66545 |
| 2018/0212035 A1 | 7/2018 | Cheng et al. |
| 2018/0240889 A1* | 8/2018 | Chi ................... H01L 29/66628 |
| 2018/0374791 A1 | 12/2018 | Smith et al. |
| 2019/0035633 A1 | 1/2019 | Jha et al. |
| 2019/0097015 A1 | 3/2019 | Zang et al. |
| 2019/0139831 A1 | 5/2019 | Zhu |
| 2019/0148384 A1* | 5/2019 | Bae ....................... H01L 23/5226 257/330 |
| 2019/0221469 A1 | 7/2019 | Hsu et al. |
| 2019/0355719 A1 | 11/2019 | Maeda et al. |
| 2020/0168607 A1 | 5/2020 | Yang |

* cited by examiner

SEMICONDUCTOR DEVICE

CROSS-REFERENCE TO RELATED APPLICATION

This application is a continuation of U.S. patent application Ser. No. 16/732,520, filed Jan. 2, 2020, in the U.S. Patent and Trademark Office, which claims priority under 35 U.S.C. § 119 to Korean Patent Application No. 10-2019-0059798, filed on May 22, 2019, in the Korean Intellectual Property Office, the disclosure of which is hereby incorporated by reference in its entirety.

TECHNICAL FIELD

Example embodiments of the present disclosure relate to a semiconductor device, and more specifically, to a semiconductor device having a gate-all-around structure.

DISCUSSION OF RELATED ART

To increase the integration of a semiconductor device, a transistor having a gate-all-around structure including a gate surrounding a silicon body of a nanowire shape formed on a substrate has been proposed.

Since a transistor of a gate-all-around structure can utilize a three-dimensional channel, it can be scaled. Further, its current control capability can be improved without increasing a gate length thereof. A short channel effect (SCE) in which the electrical potential of the channel region is affected by the drain voltage can be effectively reduced and/or suppressed in the transistor with the gate-all-around structure.

SUMMARY

According to example embodiments of the inventive concepts, a semiconductor device may include a first fin pattern and a second fin pattern separated by a first trench, each of the first fin pattern and the second fin pattern extending lengthwise in a first direction, a first nanosheet on the first fin pattern, a second nanosheet on the second fin pattern, a first fin liner extending along at least a portion of a sidewall and a bottom surface of the first trench, a first field insulation layer disposed on the first fin liner and filling a portion of the first trench, and a first gate structure overlapping an end portion of the first fin pattern and including a first gate spacer. A height from the bottom surface of the first trench to a lower surface of the first gate spacer may be greater than a height from the bottom surface of the first trench to an upper surface of the first field insulation layer.

According to example embodiments of the inventive concepts, a semiconductor device may include a first fin pattern and a second fin pattern separated by a first trench, each of the first fin pattern and the second fin pattern extending lengthwise in a first direction, a first nanosheet on the first fin pattern, a second nanosheet on the second fin pattern, a first field insulation layer filling at least a portion of the first trench, a first gate structure overlapping an end portion of the first fin pattern, a first fin liner disposed between a sidewall of the first fin pattern and the first field insulation layer and extending along at least a portion of a sidewall and a bottom surface of the first trench, and a first insulation liner extending along a sidewall of the first gate structure and an upper surface of the first field insulation layer and contacting the first fin liner.

According to example embodiments of the inventive concepts, a semiconductor device may include a first fin pattern and a second fin pattern separated by a trench, each of the first fin pattern and the second fin pattern extending lengthwise in a first direction, a first nanosheet on the first fin pattern, a second nanosheet on the second fin pattern, a fin liner extending along a portion of a sidewall and a bottom surface of the trench and defining a liner trench, a field insulation layer disposed on the fin liner and filling at least a portion of the trench, and a gate structure overlapping an end portion of the first fin pattern. Each of the first fin pattern, the second fin pattern, the first nanosheet and the second nanosheet may include a group IV-IV compound semiconductor or a group III-V compound semiconductor.

DETAILED DESCRIPTION

Figure 1:
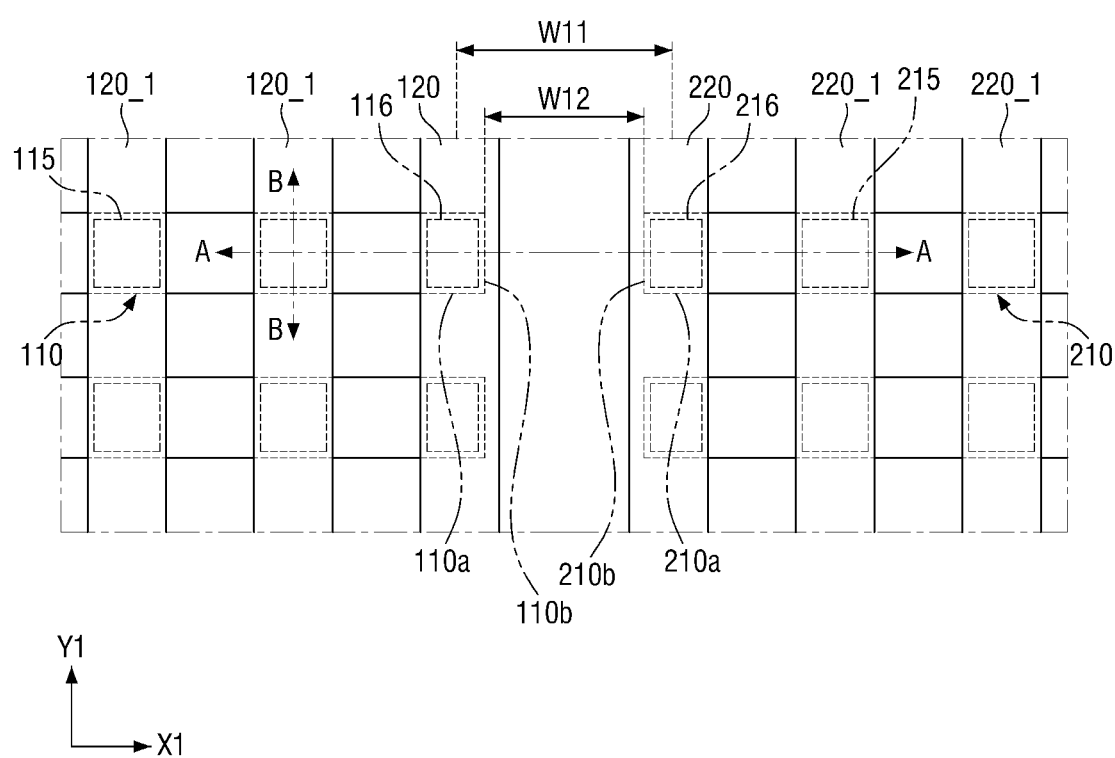
FIG. 1 is a plan view illustrating a semiconductor device, according to example embodiments of the inventive concept.

Various example embodiments will now be described more fully with reference to the accompanying drawings in which some example embodiments are shown. However, the inventive concepts may be embodied in many alternate forms and should not be construed as limited to only example embodiments set forth herein.

In the drawings of the semiconductor device according to example embodiments of the inventive concept, a gate-all-around transistor including a nanowire-shaped channel or nanosheet-shaped channel is illustrated, but the inventive concept is not limited thereto. The semiconductor device according to example embodiments of the inventive concept may include a tunneling transistor, a three dimensional transistor, or a transistor having a fin-shaped channel. The semiconductor device according to embodiments of the inventive concept may include a bipolar junction transistor, a lateral double diffused transistor (LDMOS), or the like.

Figure 2:
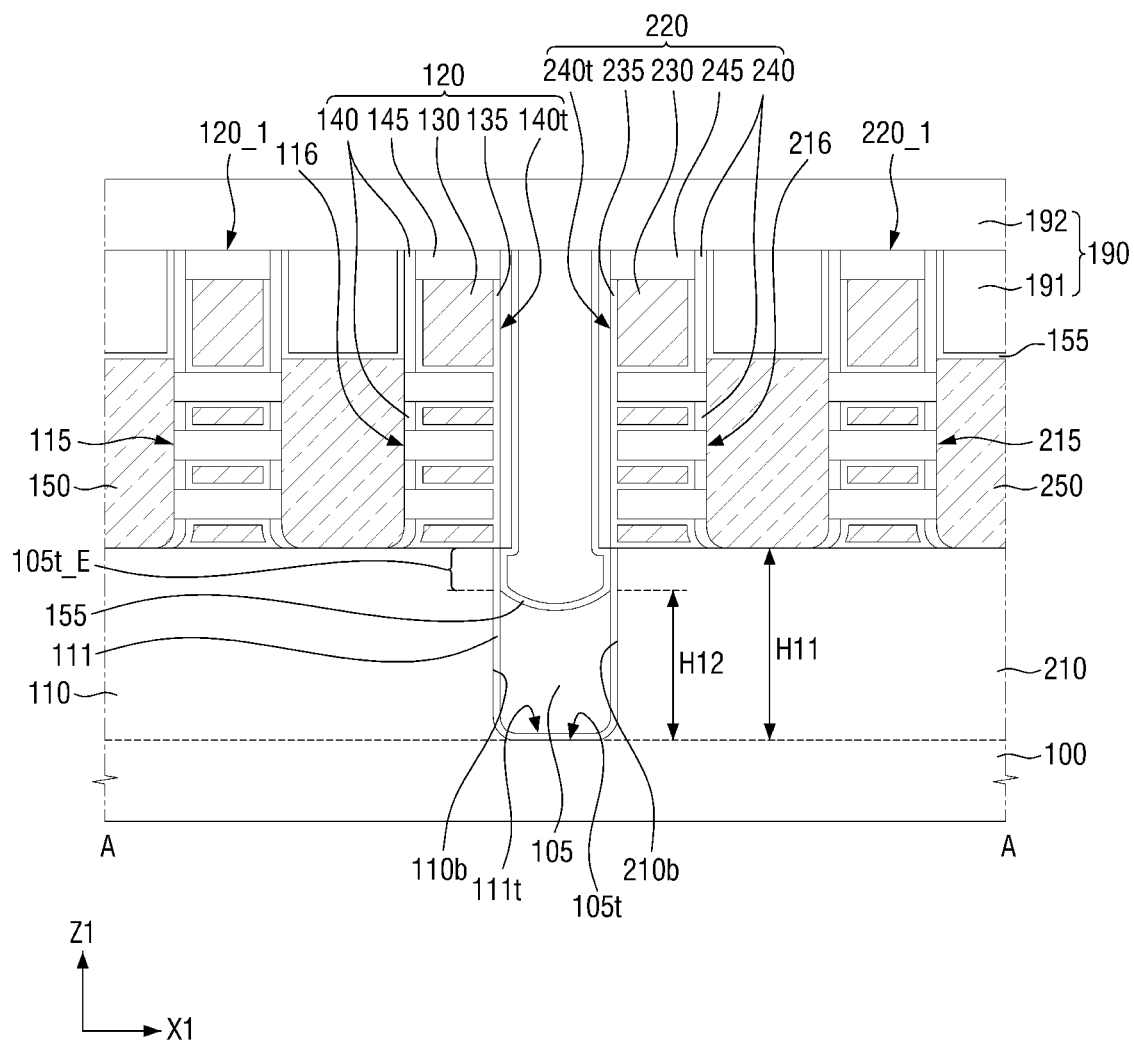
FIG. 2 is a cross-sectional view taken along line A-A of FIG. 1.
Figure 3:
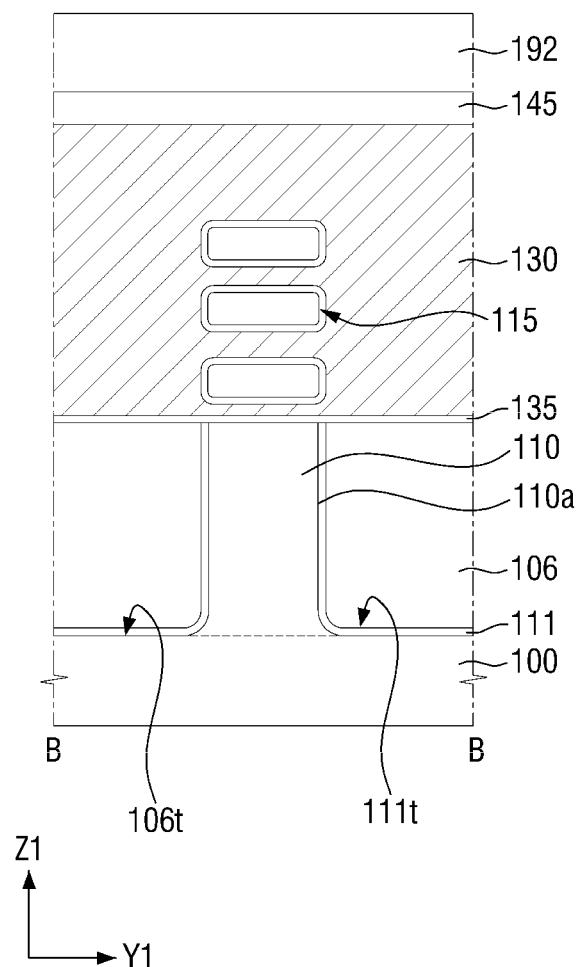
FIG. 3 is a cross-sectional view taken along line B-B of FIG. 1.

FIG. 1 is a plan view illustrating a semiconductor device according to example embodiments of the inventive concept. FIG. 2 is a cross-sectional view taken along line A-A of FIG. 1. FIG. 3 is a cross-sectional view taken along line B-B of FIG. 1. FIGS. 4A, 4B, 4C, and 4D are cross-sectional views taken along line B-B of a nanosheet of FIG. 1. FIGS. 5A, 5B, 5C, and 6 are cross-sectional views taken along line A-A of a nanosheet of FIG. 1. For convenience of explanation, an interlayer insulation layer 190 is not illustrated in FIG. 1.

Referring to FIGS. 1 to 3, a semiconductor device according to example embodiments of the inventive concept may include a substrate 100, a first fin pattern 110, a second fin pattern 210, first normal nanosheets 115, first dummy nanosheets 116, second normal nanosheets 215, second dummy nanosheets 216, first gate structures 120 and 120_1, second gate structures 220 and 220_1, a first fin liner 111, and a first insulation liner 155. The semiconductor device may have a gate-all-around structure.

The substrate 100 may be a bulk silicon substrate or a silicon-on-insulator (SOI) substrate. In some embodiments, the substrate 100 may include for example, silicon germanium, silicon germanium on insulator (SGOI), indium antimonide, lead tellurium compound, indium arsenide, indium phosphide, gallium arsenide or gallium antimonide, but it is not limited thereto.

The first fin pattern 110 and the second fin pattern 210 may protrude from the substrate 100 (e.g., in a third direction Z1, which is perpendicular to a first direction X1 and a second direction YT). The first fin pattern 110 and the second fin pattern 210 may respectively extend lengthwise along the first direction X1 parallel to an upper surface of the substrate 100. As used herein, an item, layer, or portion of an item or layer described as extending "lengthwise" in a particular direction has a length in the particular direction and a width perpendicular to that direction, where the length is greater than the width.

For example, the first fin pattern 110 may have a long sidewall 110a extending in the first direction X1 and a short sidewall 110b extending in the second direction Y1, and the second fin pattern 210 may have a long sidewall 210a extending in the first direction X1 and a short sidewall 210b extending in the second direction YT. The second direction Y1 may be perpendicular to the first direction X1 and may be parallel to the upper surface of the substrate 100. Each of the first fin pattern 110 and the second fin pattern 210 may be defined by a fin trench 106t. For example, each of the long sidewall 110a of the first fin pattern 110 and the long sidewall 210a of the second fin pattern 210 may be defined by the fin trench 106t.

The first fin pattern 110 and the second fin pattern 210 may be aligned in the first direction X1 that is a length direction thereof, and may be spaced apart from each other in the first direction X1. For example, the first fin pattern 110 and the second fin pattern 210 may be arranged in a row in the first direction X1. Upper surfaces of the first fin pattern 110 and the second fin pattern 210 may be coplanar with one another. Terms such as "same," "equal," "planar," "coplanar," or "uniform," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes.

The short sidewall 110b of the first fin pattern 110 and the short sidewall 210b of the second fin pattern 210 may face each other. The first fin pattern 110 and the second fin pattern 210 may be separated from each other by a first fin-cut trench 105t. The short sidewall 110b of the first fin pattern 110 and the short sidewall 210b of the second fin pattern 210 may be defined by the first fin-cut trench 105t.

Each of the first fin pattern 110 and the second fin pattern 210 may be formed by etching a portion of the substrate 100 or may include an epitaxial layer grown from the substrate 100. Each of the first fin pattern 110 and the second fin pattern 210 may include a semiconductor material, for example, silicon (Si) or germanium (Ge). In some embodiments, each of the first fin pattern 110 and the second fin pattern 210 may include a compound semiconductor, for example, a group IV-IV compound semiconductor or a group III-V compound semiconductor.

The group IV-IV compound semiconductor may include a binary compound or a ternary compound including at least two of carbon (C), silicon (Si), germanium (Ge), and tin (Sn), or a compound doped with a group IV element. The group III-V compound semiconductor may include a binary compound, a ternary compound, or a quaternary compound, each of which is formed by combination of a group III element, for example, at least one of aluminum (Al), gallium (Ga), and indium (In), and a group V element, for example, at least one of phosphorus (P), arsenic (As), and antimony (Sb).

The first fin pattern 110 and the second fin pattern 210 may include the same material. In some embodiments, each of the first fin pattern 110 and the second fin pattern 210 may be a silicon fin pattern including silicon.

The first fin liner 111 may extend along at least a portion of a sidewall and a bottom surface of the fin trench 106t. The first fin liner 111 may extend along at least a portion of a sidewall and a bottom surface of the first fin-cut trench 105t.

In some embodiments, the first fin liner 111 may be disposed on the whole sidewall of the fin trench 106t and on the whole sidewall of the first fin-cut trench 105t.

The first fin liner 111 may have a lower surface facing the first fin pattern 110 and the second fin pattern 210 and an upper surface opposite to the lower surface. For example, the lower surface of the first fin liner 111 may contact the first fin pattern 110 and the second fin pattern 210, and the upper surface of the first fin liner 111 may contact the first field insulation layer 105. Since the first fin liner 111 extends along the surface of the fin trench 106t and the surface of the first fin-cut trench 105t, a first liner trench 111t may be defined by the upper surface of the first fin liner 111. It will be understood that when an element is referred to as being "connected" or "coupled" to, or "on" another element, it can be directly connected or coupled to, or on the other element or intervening elements may be present. In contrast, when an element is referred to as being "directly connected,"

"directly coupled," in or "directly on" another element, there are no intervening elements present. Other words used to describe the relationship between elements should be interpreted in a like fashion (e.g., "between" versus "directly between," "adjacent" versus "directly adjacent," etc.). However, the term "contact," as used herein, refers to a direct connection (i.e., touching) unless the context indicates otherwise.

The first fin liner 111 may include, for example, silicon oxynitride, silicon nitride, and/or silicon oxide.

A first field insulation layer 105 may fill a portion of the first fin-cut trench 105t. The first field insulation layer 105 may be disposed on the short sidewall 110b of the first fin pattern 110 and on the short sidewall 210b of the second fin pattern 210. The first field insulation layer 105 may not cover a portion of the sidewall of the first fin pattern 110 and a portion of the sidewall of the second fin pattern 210. In some embodiments, the first fin liner 111 may be disposed between the first field insulation layer 105 and the first fin pattern 110 and between the first field insulation layer 105 and the second fin pattern 210. For example, the first fin liner 111 may contact the short sidewall 110b of the first fin pattern 110, the short sidewall 210b of the second fin pattern 210, and an upper surface of the substrate 100, and the first field insulation layer 105 may contact the first fin liner 111.

An upper surface of the first fin pattern 110 and an upper surface of the second fin pattern 210 may be at a higher vertical level (e.g., in the third direction Z1) than an upper surface of the first field insulation layer 105 with respect to the bottom surface of the first fin-cut trench 105t. For example, the upper surface of the first field insulation layer 105 may be at a lower vertical level (e.g., in the third direction Z1) than the upper surfaces of the first fin pattern 110 and the second fin pattern 210.

The first field insulation layer 105 may fill a portion of the first liner trench 111t. Since the first field insulation layer 105 fills the portion of the first liner trench 111t, the first field insulation layer 105 may not cover a portion of the first fin liner 111 extending along the sidewall of the first fin-cut trench 105t. For example, the first field insulation layer 105 may not cover upper portions of the first fin liner 111 that are nearer to the upper surfaces of the first fin pattern 110 and the second fin pattern 210.

A portion of the first fin liner 111 may protrude above the upper surface of the first field insulation layer 105 with respect to the bottom surface of the first fin-cut trench 105t (e.g., in the third direction Z1).

The first fin-cut trench 105t may include an exposed region 105t_E. The exposed region 105t_E of the first fin-cut trench 105t may be a region not covered by the first field insulation layer 105. For example, the exposed region 105t_E may be exposed with respect to the first field insulation layer 105. The exposed region 105t_E of the first fin-cut trench 105t may be a region not covered by a first gate spacer 140 and a second gate spacer 240.

The first fin liner 111 may be disposed to extend along a portion of the exposed region 105t_E of the first fin-cut trench 105t. In some embodiments, the first fin liner 111 may be disposed to extend along the entirety of the exposed region 105t_E of the first fin-cut trench 105t.

A second field insulation layer 106 may fill at least a portion of the fin trench 106t. The second field insulation layer 106 may fill at least a portion of the first liner trench 111t. In some embodiments, an upper surface of the second field insulation layer 106 may be coplanar with an upper surface of the first fin pattern 110 and an upper surface of the second fin pattern 210.

The second field insulation layer 106 may be disposed on the long sidewall 110a of the first fin pattern 110 and the long sidewall 210a of the second fin pattern 210. The second field insulation layer 106 may cover the entirety of the long sidewall 110a of the first fin pattern 110 and the entirety of the second fin pattern 210, but the inventive concept is not limited thereto.

The first field insulation layer 105 and the second field insulation layer 106 may include, for example, an oxide layer, a nitride layer, an oxynitride layer, or a combination thereof.

First nanosheets 115 and 116 may be disposed on the substrate 100. The first nanosheets 115 and 116 may be disposed on the first fin pattern 110. The first nanosheets 115 and 116 may include the first normal nanosheets 115 and the first dummy nanosheets 116.

The first nanosheets 115 and 116 that are spaced apart from each other in the first direction X1 may be arranged on the upper surface of the first fin pattern 110. A first epitaxial pattern 150 may be disposed between the first nanosheets 115 and 116, which are spaced apart from each other in the first direction X1.

The first dummy nanosheets 116 may be disposed adjacent to the short sidewall 110b of the first fin pattern 110 (e.g., on an end portion of the first fin pattern 110). The first dummy nanosheets 116 may be connected to one first epitaxial pattern 150. For example, the first dummy nanosheets 116 may be disposed next to one first epitaxial pattern 150 and may contact the one first epitaxial pattern 150. The first normal nanosheets 115 may be connected to two first epitaxial patterns 150 disposed at opposite sides of the first normal nanosheets 115 in the first direction X1.

Second nanosheets 215 and 216 may be disposed on the substrate 100. The second nanosheets 215 and 216 may be disposed on the second fin pattern 210. The second nanosheets 215 and 216 may include the second normal nanosheets 215 and the second dummy nanosheets 216.

The second nanosheets 215 and 216 that are spaced apart from each other in the first direction X1 may be arranged on the upper surface of the second fin pattern 210. A second epitaxial pattern 250 may be disposed between the second nanosheets 215 and 216, which are spaced apart from each other in the first direction X1.

The second dummy nanosheets 216 may be disposed adjacent to the short sidewall 210b of the second fin pattern 210 (e.g., on an end portion of the second fin pattern 210). The second dummy nanosheets 216 may be connected to one second epitaxial pattern 250. For example, the second dummy nanosheets 216 may be disposed adjacent to one second epitaxial pattern 250 and may contact the one second epitaxial pattern 250. The second normal nanosheets 215 may be connected to two second epitaxial patterns 250 disposed at opposite sides of the second normal nanosheets 215 in the first direction X1. For example, the second normal nanosheets 215 may be disposed between two second epitaxial patterns 250 and may contact the two second epitaxial patterns 250.

Each of the first nanosheets 115 and 116 and the second nanosheets 215 and 216 may include a plurality of nanosheets sequentially arranged in a thickness direction of the substrate 100 (e.g., the third direction Z1). A plurality of first nanosheets 115 and 116 may be sequentially arranged on the first fin pattern 110. For example, each of the pluralities of first nanosheets 115 and 116 may be stacked on the first fin pattern 110 in the third direction Z1. A plurality of second nanosheets 215 and 216 may be sequentially arranged on the second fin pattern 210. For example, each of the pluralities of second nanosheets 215 and 216 may be stacked on the second fin pattern 210 in the third direction Z1.

In FIGS. 2 and 3, it is illustrated that each of the first nanosheets 115 and 116 and the second nanosheets 215 and 216 includes three nanosheets stacked in the thickness direction of the substrate 100 (e.g., the third direction Z1), but the inventive concept is not limited thereto. For example, the first nanosheets 115 and 116 may include one first nanosheet 115 and one first nanosheet 116, and the second nanosheets 215 and 216 may include one second nanosheet 215 and one second nanosheet 216. As another example, the first nanosheets 115 and 116 may include more than three first nanosheets 115 and more than three first nanosheets 116, and the second nanosheets 215 and 216 may include more than three second nanosheets 215 and more than three second nanosheets 216.

The first fin pattern 110 and the first nanosheets 115 and 116 may be formed by selectively etching a portion of a fin structure including the first fin pattern 110 and the first nanosheets 115 and 116. Thus, a width of each of the first nanosheets 115 and 116 in the second direction Y1 may be equal to or less than a width of the first fin pattern 110 in the second direction YT. A sidewall of the first dummy nanosheets 116 may be aligned with the short sidewall 110b of the first fin pattern 110. For example, a sidewall of the first dummy nanosheets 116 may be on a same plane in the third direction Z1 as the short sidewall 110b of the first fin pattern 110.

Likewise, the second fin pattern 210 and the second nanosheets 215 and 216 may have the same relationship with one another as that described above with respect to the first fin pattern 110 and the first nanosheets 115 and 116.

Each of the first nanosheets 115 and 116 and the second nanosheets 215 and 216 may include a semiconductor material, for example, silicon or germanium. In some embodiments, each of the first nanosheets 115 and 116 and the second nanosheets 215 and 216 may include a compound semiconductor, for example, a group IV-IV compound semiconductor or a group III-V compound semiconductor.

The first nanosheets 115 and 116 may include the same material as corresponding ones of the second nanosheets 215 and 216 at the same height level (e.g., vertical level in the third direction Z1).

The first normal nanosheets 115 and the second normal nanosheets 215 may be used as channel regions of respective ones of transistors including the first normal nanosheets 115 and the second normal nanosheets 215. The first normal nanosheets 115 including the plurality of nanosheets that are stacked in the thickness direction of the substrate 100 and the second normal nanosheets 215 including the plurality of nanosheets that are stacked in the thickness direction of the substrate 100 may include the same material or different materials. For example, a lowermost one of the plurality of nanosheets of the first normal nanosheets 115 adjacent to the first fin pattern 110 and a next lowermost one of the plurality of nanosheets of the first normal nanosheets 115 adjacent to the first fin pattern 110 may have the same material or different materials.

The first nanosheets 115 and 116 may include the same material as, or a different material from, the first fin pattern 110.

Each of the first gate structures 120 and 120_1 may extend lengthwise in the second direction YT. The first gate structures 120 and 120_1 may cross the first fin pattern 110. The first gate structures 120 and 120_1 may include a first end gate structure 120 and a first normal gate structure 120_1.

The first end gate structure 120 may overlap the end portion of the first fin pattern 110. The first end gate structure 120 may overlap the short sidewall 110b of the first fin pattern 110. For example, the first end gate structure 120 may extend beyond the short sidewall 110b of the first fin pattern 110 in the first direction X1.

The first gate structures 120 and 120_1 may traverse the first nanosheets 115 and 116, respectively, and may be spaced apart from each other in the first direction X1. The first normal gate structure 120_1 may surround each of the first normal nanosheets 115. The first end gate structure 120 may surround each of the first dummy nanosheets 116.

Each of the second gate structures 220 and 220_1 may extend lengthwise in the second direction Y1. Each of the second gate structures 220 and 220_1 may cross the second fin pattern 210. The second gate structures 220 and 220_1 may include a second end gate structure 220 and a second normal gate structure 220_1. The second end gate structure 220 may overlap the end portion of the second fin pattern 210. The second end gate structure 220 may overlap the short sidewall 210b of the second fin pattern 210. For example, the second end gate structure 220 may extend beyond the short sidewall 210b of the second fin pattern 210 in the negative first direction X1.

The second gate structures 220 and 220_1 may traverse the second nanosheets 215 and 216, respectively, and may be spaced apart from each other in the first direction X1. The second normal gate structure 220_1 may surround each of the second normal nanosheets 215. The second end gate structure 220 may surround each of the second dummy nanosheets 216.

In some embodiments, the first end gate structure 120 and the second end gate structure 220 may contact the first fin liner 111 extending along the sidewall of the first fin-cut trench 105t. For example, the first and second end gate structures 120 may contact upper surfaces of the first fin liner 111.

The first end gate structure 120 and the second end gate structure 220 may be spaced apart from the upper surface of the first field insulation layer 105 in a height direction of the first fin pattern 110 and a height direction of the second fin pattern 210. For example, lower surfaces of the first end gate structure 120 and the second end gate structure 220 may be at a higher vertical level (e.g., in the third direction Z1) than an upper surface of the first field insulation layer 105.

A portion of the first fin liner 111 may not be covered by the first field insulation layer 105 between the lower surface of the first end gate structure 120 and the upper surface of the first field insulation layer 105. A portion of the first fin liner 111 may not be covered by the first field insulation layer 105 between the lower surface of the second end gate structure 220 and the upper surface of the first field insulation layer 105.

In some embodiments, the first end gate structure 120 and the second end gate structure 220 may not contact the first field insulation layer 105 between the short sidewall 110b of the first fin pattern 110 and the short sidewall 210b of the second fin pattern 210, whereas the first end gate structure 120 and the second end gate structure 220 may contact the second field insulation layer 106 disposed on the long sidewall 110a of the first fin pattern 110 and the long sidewall 210a of the second fin pattern 210.

A distance from a center line of the first end gate structure 120 to a center line of the second end gate structure 220 may be a first distance W11. A distance between the first fin pattern 110 and the second fin pattern 210 separated by the first fin-cut trench 105t may be a second distance W12. In some embodiments, the second distance W12 may be the distance between the short sidewall 110b of the first fin pattern 110 and the short sidewall 210b of the second fin pattern 210. For example, the second distance W12 may be defined based on the upper surface of the first fin pattern 110 and the upper surface of the second fin pattern 210. In some embodiments, the second distance W12 may be a distance between the first dummy nanosheets 116 and the second dummy nanosheets 216.

In some embodiments, the first distance W11 may be greater than the second distance W12. For example, a pitch between adjacent ones of the first gate structures 120 and 120_1 and the second gate structures 220 and 220_1 may be greater than a separation width between the first fin pattern 110 and the second fin pattern 210 that are adjacent to each other.

Each of the first gate structures 120 and 120I may include a first gate electrode 130, a first gate insulation layer 135, first gate spacers 140, a first gate trench 140t, and a first capping pattern 145. Each of the second gate structures 220 and 220_1 may include a second gate electrode 230, a second gate insulation layer 235, second gate spacers 240, a second gate trench 240t, and a second capping pattern 245.

Hereinafter, it will be described with respect to the first gate structures 120 and 120_1. Descriptions of the second gate structures 220 and 220_1 will be understood through descriptions of the first gate structures 120 and 120_1. For example, descriptions of the second gate electrode 230, the second gate insulation layer 235, the second gate spacers 240, the second gate trench 240t, and the second capping pattern 245 may be the same as descriptions of the first gate electrode 130, the first gate insulation layer 135, the first gate spacers 140, the first gate trench 140t, and the first capping pattern 145, respectively.

The first gate spacers 140 may extend lengthwise in the second direction Y1. The first gate spacers 140 may cross the first nanosheets 115 and 116. The first gate spacers 140 may define the first gate trench 140t traversing the first nanosheets 115 and 116. For example, the interior sidewalls of the first gate spacers 140 may define the first gate trench 140t.

The first gate spacers 140 may be disposed on opposite end portions, respectively, of the first normal nanosheets 115 extending in the first direction X1. For example, the first gate spacers 140 may be disposed on opposite sides of the first normal nanosheets 115. The first gate spacers 140 may each include a through portion through which the first normal nanosheets 115 pass.

Each nanosheet of the first normal nanosheets 115 may pass through the first gate spacers 140. The first gate spacers 140 may contact entire circumferential surfaces of end portions of each nanosheet of the first normal nanosheets 115.

However, the first dummy nanosheets 116 may pass through one of the first gate spacers 140. The first gate spacer 140 through which the first dummy nanosheets 116 pass may contact entire circumferential surfaces of one end portion of each nanosheet of the first dummy nanosheets 116.

The first gate spacers 140 may be disposed between the first fin pattern 110 and the lowermost nanosheet of each of the first nanosheets 115 and 116 and between respective nanosheets of the first nanosheets 115 and 116.

The first gate spacer 140 disposed on the end portion of the first fin pattern 110 may not contact the upper surface of the first field insulation layer 105 between the short sidewall 110b of the first fin pattern 110 and the short sidewall 210b of the second fin pattern 210.

A portion of the first fin liner 111 not covered by the first field insulation layer 105 may be disposed between the first gate spacer 140 and the upper surface of the first field insulation layer 105. For example, the first gate spacer 140 may be above the portion of the first fin liner 111 that is not covered by the first field insulation layer 105.

A height H11 from the bottom surface of the first fin-cut trench 105t to a lower surface of the first gate spacer 140 may be greater than a height H12 from the bottom surface of the first fin-cut trench 105t to the upper surface of the first field insulation layer 105. In some embodiments, the bottom surface of the first fin-cut trench 105t may be on the same plane as the upper surface of the substrate 100, and the height H11 may be the distance between the upper surface of the substrate 100 and the upper surface of the first fin pattern 110 or the second fin pattern 210.

The first gate spacers 140 may include, for example, silicon nitride (SiN), silicon oxynitride (SiON), silicon oxide (SiO$_2$), silicon oxycarbonitride (SiOCN), silicon boron nitride (SiBN), silicon oxyboronitride (SiOBN), silicon oxycarbide (SiOC), or a combination thereof.

The first gate insulation layer 135 may be disposed along the circumferential surfaces of the first nanosheets 115 and 116. The first gate insulation layer 135 may surround each nanosheet of the first nanosheets 115 and 116. The first gate insulation layer 135 may be disposed on the upper surface of the second field insulation layer 106 and on the first fin pattern 110. The first gate insulation layer 135 may extend along inner surfaces of the first gate spacers 140.

The first gate insulation layer 135 may extend along a sidewall and a bottom surface of the first gate trench 140t and along the circumferential surface of each nanosheet of the first nanosheets 115 and 116.

An interfacial layer (not shown) may be disposed between the first gate insulation layer 135 and each nanosheet of the first nanosheets 115 and 116 and between the first gate insulation layer 135 and the first fin pattern 110. Depending on a method of forming the interfacial layer, the interfacial layer may be formed with the same profile as the first gate insulation layer 135.

The first gate insulation layer 135 may include silicon oxide, silicon oxynitride, silicon nitride, and/or a high-k dielectric material having a higher dielectric constant than silicon oxide. The first gate insulation layer 135 may include the high-k dielectric material, for example, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and/or lead zinc niobate.

The first gate electrode 130 may traverse the first fin pattern 110 and the first nanosheets 115 and 116. The first gate electrode 130 may surround the circumferential surface of each nanosheet of the first nanosheets 115 and 116. The first gate electrode 130 may be disposed in a space between the first fin pattern 110 and the lowermost nanosheet of each of the first nanosheets 115 and 116. The first gate electrode 130 may be disposed between the first gate spacers 140. The first gate electrode 130 may fill a portion of the first gate trench 140t and may extend lengthwise in the second direction Y1.

The first gate electrode 130 may include, for example, titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V), or a combination thereof. The first gate electrode 130 may include conductive metal oxide or conductive metal oxynitride. The first gate electrode 130 may include an oxidized form of the above-mentioned material.

The first gate electrode 130 may be formed by a replacement process or a gate last process, but it is not limited thereto.

The first capping pattern 145 may be disposed on the first gate electrode 130. The first capping pattern 145 may fill the remainder of first gate trench 140t having the first gate electrode 130. In some embodiments, an upper surface of the first capping pattern 145 may be coplanar with upper surfaces of the first gate spacers 140.

Although the first gate insulation layer 135 is shown not to be disposed between the first gate spacers 140 and the first capping pattern 145, it is for convenience of explanation, and the inventive concept is not limited thereto. For example, in some embodiments, the first gate insulation layer 135 may be disposed between the first gate spacers 140 and the first capping pattern 145.

In FIG. 2, the first capping pattern 145 is shown to be disposed between the inner sidewalls of the first gate spacers 140, but the inventive concept is not limited thereto. Upper surfaces of the first gate spacers 140 may be recessed lower than an upper surface of a lower interlayer insulation layer 191 disposed between the adjacent ones of the first and second gate structures 120, 120_1, 220, and 220_1, like the first gate electrode 130. For example, in some embodiments, the upper surfaces of the first gate spacers 140 may be coplanar with upper surfaces of the first gate electrode 130. As such, the first capping pattern 145 may be disposed on the upper surfaces of the first gate spacers 140 and an upper surface of the first gate electrode 130.

An upper surface of the first capping pattern 145 may be coplanar with the upper surface of the lower interlayer insulation layer 191. The first capping pattern 145 may include a material having an etch selectivity with respect to a material of the lower interlayer insulation layer 191. The first capping pattern 145 may include, for example, silicon nitride (SiN), silicon oxynitride (SiON), silicon oxide (SiO$_2$), silicon carbonitride (SiCN), silicon oxycarbonitride (SiOCN), or a combination thereof.

A first epitaxial pattern 150 may be disposed between the adjacent first gate structures 120 and 120_1. The first epitaxial pattern 150 may be disposed on the first fin pattern 110. The first epitaxial pattern 150 may be disposed at the opposite sides of the first normal nanosheets 115. The first epitaxial pattern 150 may be disposed at one side of the first dummy nanosheets 116. For example, the first epitaxial pattern 150 may be disposed between the first normal nanosheets 115 and the first dummy nanosheets 116. The first epitaxial pattern 150 may be connected to the first nanosheets 115 and 116. For example, the first epitaxial pattern 150 may contact the first nanosheets 115 and 116.

A second epitaxial pattern 250 may be disposed between the adjacent second gate structures 220 and 220_1. The second epitaxial pattern 250 may be disposed on the second fin pattern 210. The second epitaxial pattern 250 may be disposed at the opposite sides of the second normal nanosheets 215. The second epitaxial pattern 250 may be disposed at one side of the second dummy nanosheets 216. For example, the second epitaxial pattern 250 may be disposed between the second normal nanosheets 215 and the second dummy nanosheets 216. The second epitaxial pattern 250 may be connected to the second nanosheets 215 and 216. For example, the second epitaxial pattern 250 may contact the second nanosheets 215 and 216.

The first epitaxial pattern 150 and the second epitaxial pattern 250 may be formed by an epitaxial growth process.

The first epitaxial pattern 150 may be included in a source/drain of the transistor utilizing the first normal nanosheets 115 as the channel region. The second epitaxial pattern 250 may be included in a source/drain of the transistor utilizing the second normal nanosheets 215 as the channel region.

The first epitaxial pattern 150 and the second epitaxial pattern 250 may be included in source/drains of the transistors of the same conductive type. When each of the first epitaxial pattern 150 and the second epitaxial pattern 250 is included in a source/drain of a PMOS transistor, each of the first epitaxial pattern 150 and the second epitaxial pattern 250 may include a compressive stress material. The compressive stress material may be a material having a larger lattice constant than silicon. For example, the compressive stress material may be silicon germanium (SiGe). When each of the first epitaxial pattern 150 and the second epitaxial pattern 250 is included in a source/drain of an NMOS transistor, each of the first epitaxial pattern 150 and the second epitaxial pattern 250 may include a tensile stress material. For example, the tensile stress material may be silicon (Si) or silicon carbide (SiC).

The first insulation liner 155 may extend along a profile of the first epitaxial pattern 150, a profile of the second epitaxial pattern 250, outer sidewalls of the first gate spacers 140, outer sidewalls of the second gate spacers 240, and the upper surface of the first field insulation layer 105. For example, the first insulation liner 155 may contact top surfaces of the first and second epitaxial patterns 150 and 250, outer sidewalls of the first and second gate spacers 140 and 240, and the upper surface of the first field insulation layer 105.

The first insulation liner 155 may contact the first fin liner 111 between the first gate spacer 140 and the first field insulation layer 105 and between the second gate spacer 240 and the first field insulation layer 105. For example, the first insulation liner 155 may contact the first fin liner 111 between the first end gate structure 120 and the first field insulation layer 105 and between the second end gate structure 220 and the first field insulation layer 105.

A portion of the first insulation liner 155 may be disposed between the first gate spacer 140 and the upper surface of the first field insulation layer 105, such that the first gate spacer 140 may not contact the first field insulation layer 105. A portion of the first insulation liner 155 may be disposed between the second gate spacer 240 and the upper surface of the first field insulation layer 105, such that the second gate spacer 240 may not contact the first field insulation layer 105.

The first insulation liner 155 may be disposed along at least a portion of the exposed region 105t_E of the first fin-cut trench 105t. The first insulation liner 155 may be disposed on a portion of the first liner trench 111t defined by the first fin liner 111.

The first insulation liner 155 may include, for example, silicon nitride (SiN), silicon oxynitride (SiON), silicon oxide (SiO$_2$), silicon carbonitride (SiCN), silicon oxycarbonitride (SiOCN), or a combination thereof. The first insulation liner 155 may include a material having an etch selectivity with respect to the lower interlayer insulation layer 191.

The interlayer insulation layer 190 may be disposed on the first insulation liner 155. The interlayer insulation layer 190 may cover the outer sidewalls of the first gate spacers 140 and the outer sidewalls of the second gate spacers 240.

The interlayer insulation layer 190 may include the lower interlayer insulation layer 191 and an upper interlayer insulation layer 192 on the lower interlayer insulation layer 191. The lower interlayer insulation layer 191 may be disposed between the adjacent ones of the first and second gate structures 120, 120_1, 220, and 220_1. For example, the lower interlayer insulation layer 191 may be disposed on the first insulation liner 155, and may contact the first insulation liner 155. The upper interlayer insulation layer 192 may be disposed on the first gate structures 120 and 120_1 and the second gate structures 220 and 220_1. The lower interlayer insulation layer 191 and the upper interlayer insulation layer 192 may include, for example, silicon oxide, silicon nitride, and/or silicon oxynitride.

A cross-section of example first normal nanosheets 115 taken in the second direction Y1 will be described with reference to FIGS. 4A to 4D.

Referring to 4A, a cross-section 115s of the first normal nanosheet 115A may be a shape formed by combination of four straight lines 115m and four curved lines 115n. For example, the cross-section 115s of the first normal nanosheet 115A may be a quadrilateral with rounded corners. In the cross-section 115s of the first normal nanosheet 115A, a width L1 of the first normal nanosheet 115A may be different from a height L2 of the first normal nanosheet 115A. For example, the cross-section 115s of the first normal nanosheet 115A may be a rectangle with rounded corners, but it is not limited thereto.

Figure 4A:
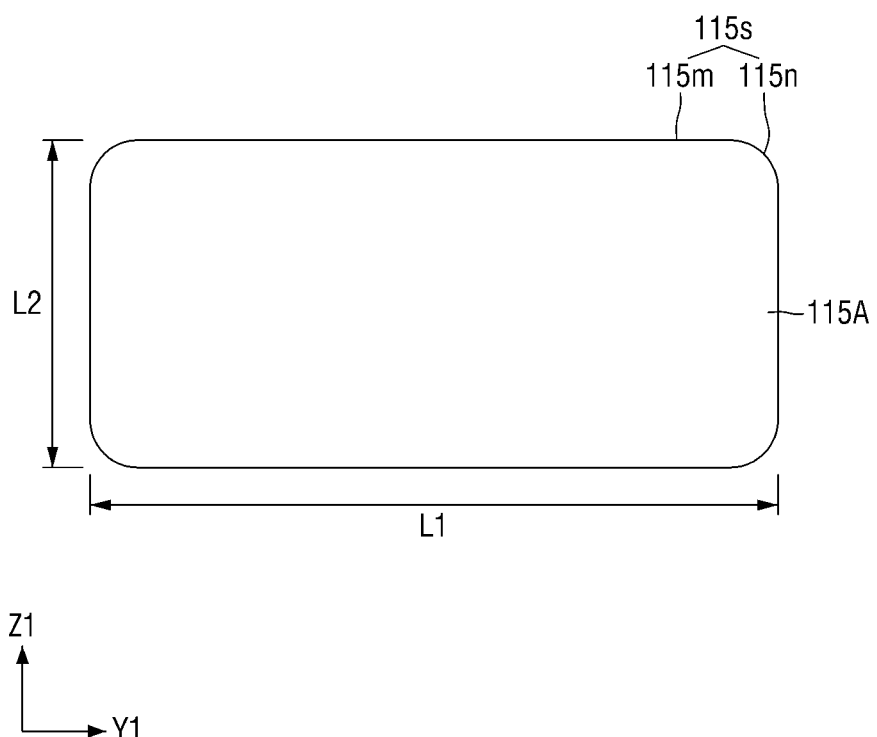
FIGS. 4A, 4B, 4C, and 4D are cross-sectional views taken along line B-B of a nanosheet of FIG. 1.
Figure 4B:
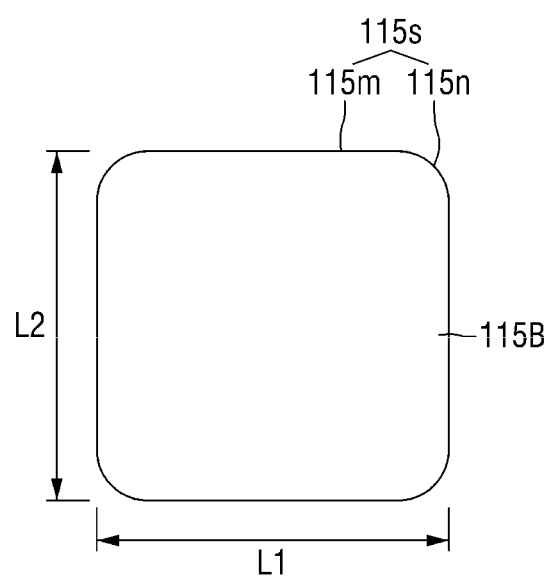

Referring to FIG. 4B, in the cross-section 115s of the first normal nanosheet 115B, the width L1 of the first normal nanosheet 115B and the height L2 of the first normal nanosheet 115B may be the same. For example, the cross-section 115s of the first normal nanosheet 115B may be a square with rounded corners, but it is not limited thereto.

Figure 4C:
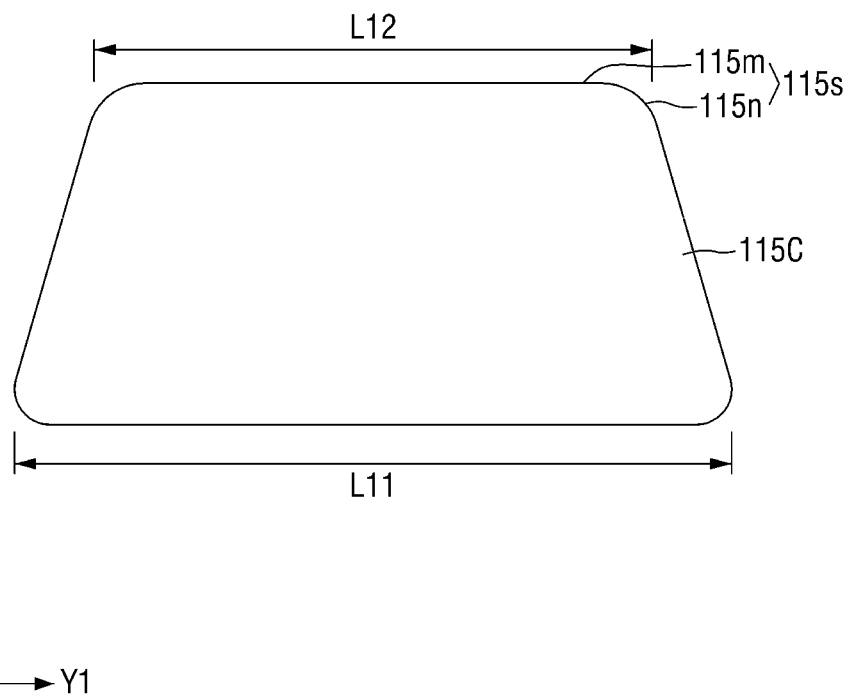

Referring to FIG. 4C, in the cross-section 115s of the first normal nanosheet 115C, a width L11 of one of opposite sides of the first normal nanosheet 115C may be different from a width L12 of the other of the opposite sides of the first normal nanosheet 115C. For example, the cross-section 115s of the first normal nanosheet 115C may be a trapezoid with rounded corners, but it is not limited thereto.

Figure 4D:
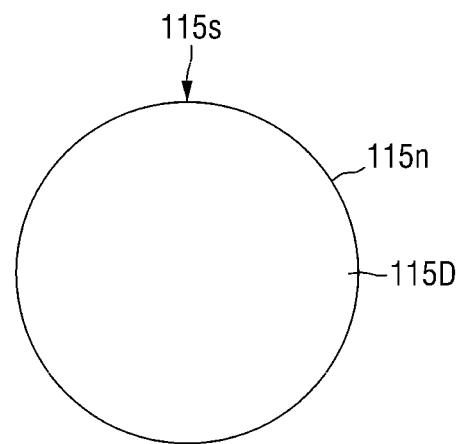
Figure 4D:
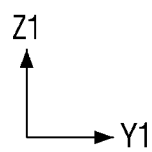

Referring to FIG. 4D, the cross-section 115s of the first normal nanosheet 115D may be a shape formed by combination of curved lines 115n, for example, a circle.

In some embodiments, unlike those shown in FIG. 4A to 4D, the cross-section 115s of the first normal nanosheet 115 may be a shape formed by a combination of straight lines (e.g., a polygon). For example, the cross-section 115s of the first normal nanosheet 115 may be a shape formed by four linear segments that intersect one another (e.g., a quadrilateral without rounded corners). As another example, the cross-section 115s of the first normal may be a shape formed by three linear segments that intersect one another (e.g., a triangle).

A cross-section of example first normal nanosheets 115 taken in the first direction X1 will be described with reference to FIGS. 5A to 5C.

Figure 5A:
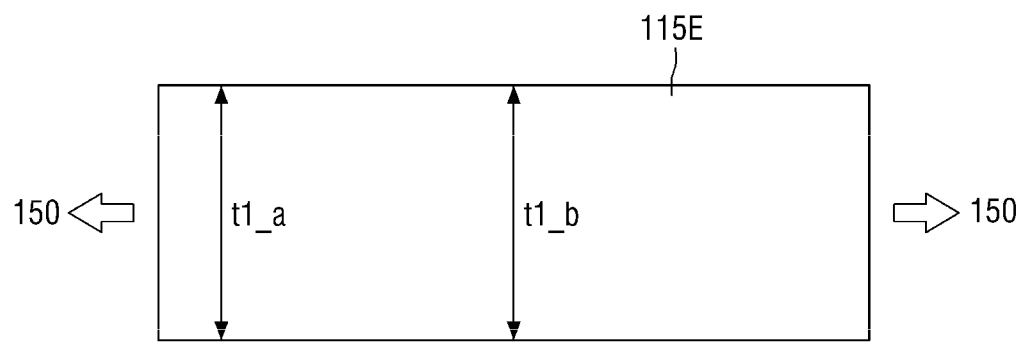
FIGS. 5A, 5B, and 5C are cross-sectional views taken along line A-A of a nanosheet of FIG. 1.
Figure 5A:
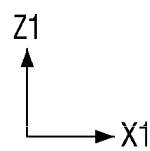

Referring to FIG. 5A, a thickness of the first normal nanosheet 115E may be substantially constant in a direction extending away from the first epitaxial pattern 150 and the first gate spacers 140 (e.g., in the first direction X1). For example, a thickness t1_a of the end portion of the first normal nanosheet 115E adjacent to the first epitaxial pattern 150 may be equal to a thickness t1_b of a central portion of the first normal nanosheet 115E. Thickness may refer to the thickness or height measured in a direction perpendicular to a top surface of the substrate 100 (e.g., the third direction Z1).

Figure 5B:
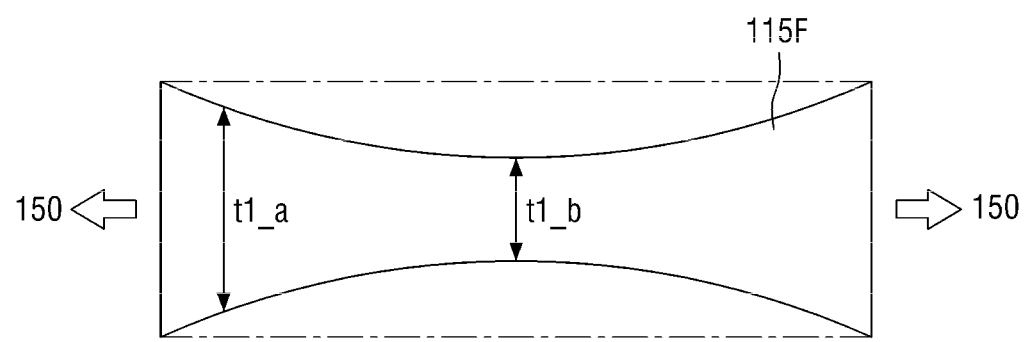
Figure 5B:
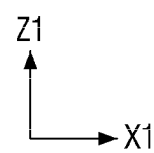

Referring to FIG. 5B, the thicknesses of the first normal nanosheet 115F may decrease in the direction extending away from the first epitaxial pattern 150 and the first gate spacers 140. For example, the thickness t1_a of the opposite end portions of the first normal nanosheet 115F adjacent to the first epitaxial pattern 150 may be greater than the thickness t1_b of the central portion of the first normal nanosheet 115F. In some embodiments, the upper surface of the first normal nanosheet 115F may have a concave shape with respect to a top surface of the substrate 100, and the lower surface of first normal nanosheet 115F may have a convex shape with respect to the top surface of the substrate 100.

Figure 5C:
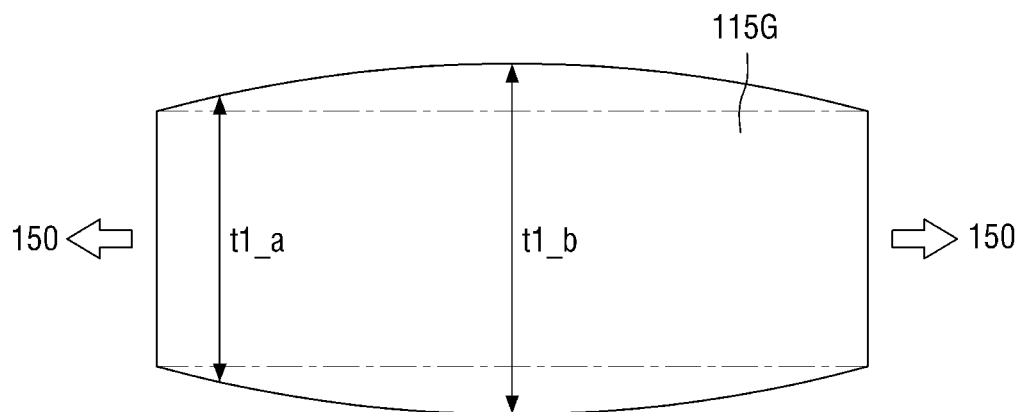
Figure 5C:
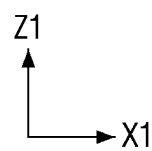

Referring to FIG. 5C, the thickness of the first normal nanosheet 115G may increase in the direction extending away from the first epitaxial pattern 150 and the first gate spacers 140. For example, the thicknesses t1_a of the opposite end portions of the first normal nanosheet 115G adjacent to the first epitaxial pattern 150 may be smaller than the thickness t1_b of the central portion of the first normal nanosheet 115G. In some embodiments, the upper surface of the first normal nanosheet 115G may have a convex shape with respect to a top surface of the substrate 100, and the lower surface of first normal nanosheet 115G may have a concave shape with respect to the top surface of the substrate 100.

In FIGS. 5B and 5C, the thicknesses of the first normal nanosheets 115F and 115G may continuously change in the direction extending away from the first epitaxial pattern 150 and the first gate spacers 140. For example, the thickness of the first normal nanosheet 115F may gradually and continuously decrease in directions toward the middle of the first normal nanosheet 115F, and the thickness of the first normal nanosheet 115G may gradually and continuously increase in directions toward the middle of the first normal nanosheet 115G.

A cross-section of example first normal nanosheet 115H taken in the first direction X1 will be described with reference to FIG. 6.

The first normal nanosheet 115H may be a trimmed sheet pattern. The first normal nanosheet 115H may include a first portion 115a and second portions 115b. The second portions 115b of the first normal nanosheet 115H may be disposed at opposite sides of the first portion 115a of the first normal nanosheet 115H. The second portions 115b of the first normal nanosheet 115H may be overlapped with the first gate spacers 140. The first portion 115a of the first normal nanosheet 115H may be overlapped with the first gate insulation layer 135 and the first gate electrode 130.

Thicknesses t1_c of the second portions 115b of the first normal nanosheet 115 may be greater than a thickness t1_d of the first portion 115a of the first normal nanosheet 115. The change from the thicknesses t1_c to the thickness t1_d (and vice versa) may be abrupt, such that inner vertical sidewalls may be formed in the first normal nanosheet 115H. The inner vertical sidewalls may include upper inner vertical sidewalls 115c_u and lower inner vertical sidewalls 115c_l of the second portions 115b. The upper inner vertical sidewalls 115c_u may connect planar upper surfaces of the second portions 115b to a planar upper surface of the first portion 115a, and the lower inner vertical sidewalls 115c_l may connect planar lower surfaces of the second portions 115b to a planar lower surface of the first portion 115a.

Figure 6:
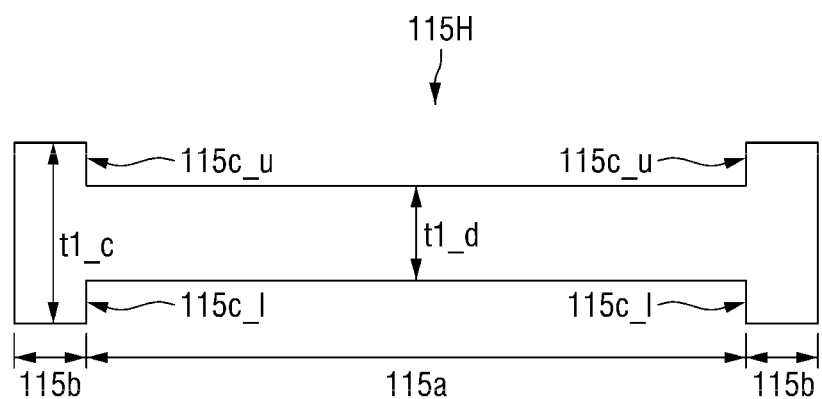
FIG. 6 is a cross-sectional view taken along line A-A of a nanosheet of FIG. 1.
Figure 6:
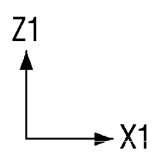

Unlike that shown in FIG. 6, in some embodiments, a connection portion between the second portion 115b of the first normal nanosheet 115H and the first portion 115a of the first normal nanosheet 115H may be rounded. In FIG. 6, although the thickness of the first portion 115a of the first normal nanosheet 115H is shown to be constant regardless of its location, it is for convenience of explanation, and the inventive concept is not limited thereto. For example, the thickness of the first portion 115a of the first normal nanosheet 115H may change as shown in FIG. 5B or 5C.

Figure 7:
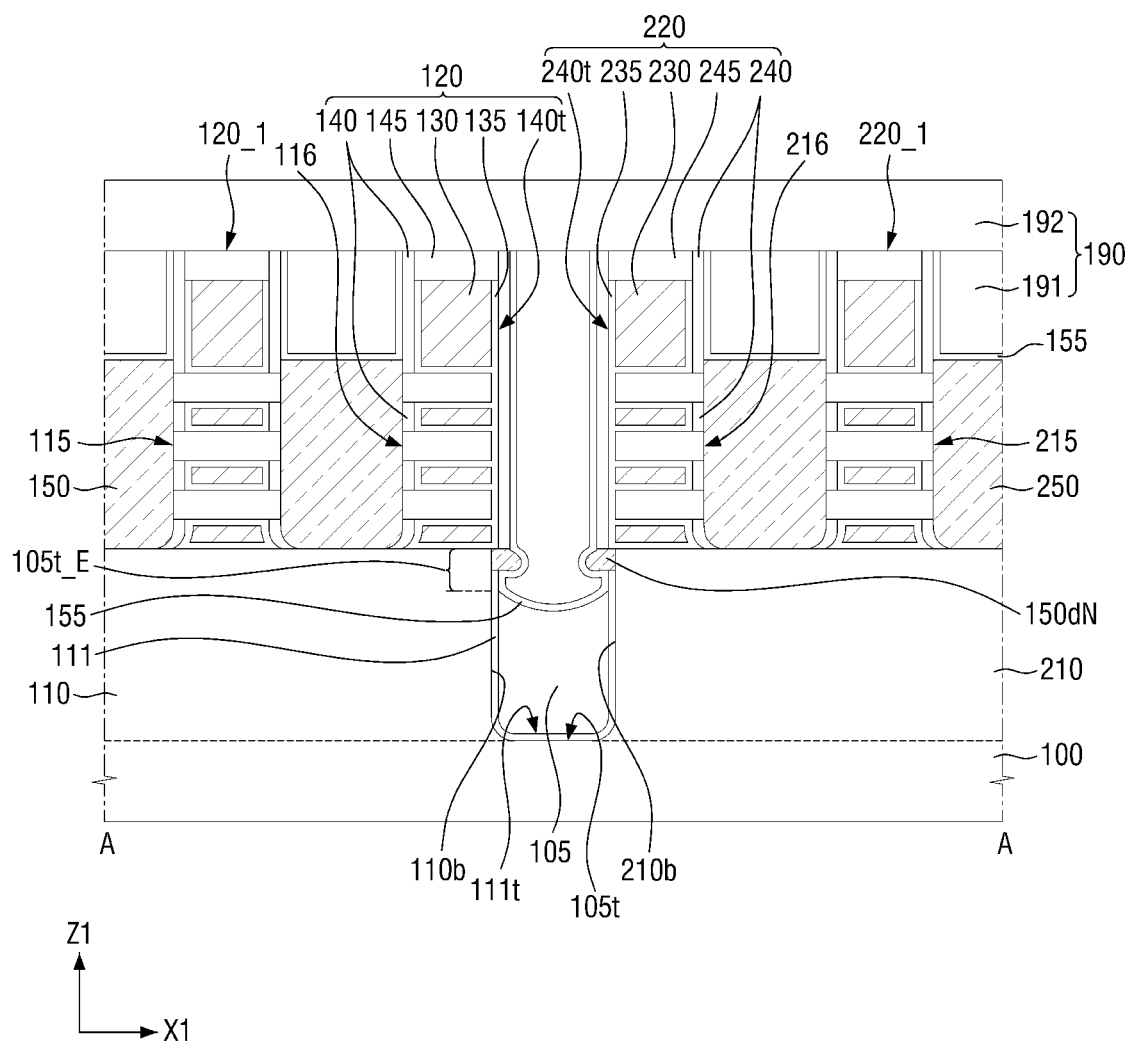
FIG. 7 is a view illustrating a semiconductor device, according to example embodiments of the inventive concept.

FIG. 7 is a view illustrating a semiconductor device according to example embodiments of the inventive concept. In FIG. 7, main differences between the present embodiment and the embodiments of FIGS. 1 to 6 will be described.

Referring to FIG. 7, a semiconductor device according to example embodiments of the inventive concept may further include a semiconductor nodule 150dN protruding from the short sidewall 110b of the first fin pattern 110 toward the second fin pattern 210.

The semiconductor nodule 150dN may also be disposed on the short sidewall 210b of the second fin pattern 210. The semiconductor nodule 150dN may be formed on the region(s) of the first fin pattern 110 and/or the second fin pattern 210 corresponding to the exposed region 105t_E of the first fin-cut trench 105t.

The semiconductor nodule 150dN may be disposed on the short sidewall 110b of the first fin pattern 110 between the lower surface of the first end gate structure 120 and the upper surface of the first field insulation layer 105. In addition, the semiconductor nodule 150dN may be disposed on the short sidewall 210b of the second fin pattern 210 between the lower surface of the second end gate structure 220 and the upper surface of the first field insulation layer 105.

In some embodiments, the semiconductor nodule 150dN may be disposed on one of the first fin pattern 110 and the second fin pattern 210.

The first fin liner 111 may be partly disposed on the exposed region 105t_E of the first fin-cut trench 105t. For example, the first fin liner 111 may be disposed on a portion of the exposed region 105t_E of the first fin-cut trench 105t and may not be disposed on the remainder of the exposed region 105t_E of the first fin-cut trench 105t.

The exposed region 105t_E of the first fin-cut trench 105t on which the first fin liner 111 is not disposed may not be covered by the first field insulation layer 105, the first gate spacer 140, and the second gate spacer 240.

The semiconductor nodule 150dN may be disposed on the short sidewall 110b of the first fin pattern 110 and/or the short sidewall 210b of the second fin pattern 210 that are not covered by the first fin liner 111, the first field insulation layer 105, the first gate spacer 140, and the second gate spacer 240. In some embodiments, the semiconductor nodule 150dN formed on the first fin pattern 110 may contact an upper surface of the first fin liner 111 and a lower surface of the first gate spacer 140, and the semiconductor nodule 150dN formed on the second fin pattern 210 may contact an upper surface of the first fin liner 111 and a lower surface of the second gate spacer 240.

The semiconductor nodule 150dN may include the material included in the first epitaxial pattern 150 and the second epitaxial pattern 250.

The first insulation liner 155 may extend along a profile of the semiconductor nodule 150dN. For example, the first insulation liner 155 may contact the semiconductor nodule 150dN.

As shown in FIG. 7, the semiconductor nodule 150dN may be disposed between the first gate spacer 140 and the first fin liner 111 and between the second gate spacer 240 and the first fin liner 111, but the inventive concept is not limited thereto.

In some embodiments, a portion of the first fin liner 111 may remain between the semiconductor nodule 150dN and the first gate spacer 140, and/or between the semiconductor nodule 150dN and the second gate spacer 240.

In some embodiments, the semiconductor nodule 150dN protruding from the first fin pattern 110 may contact the semiconductor nodule 150dN protruding from the second fin pattern 210.

Figure 8:
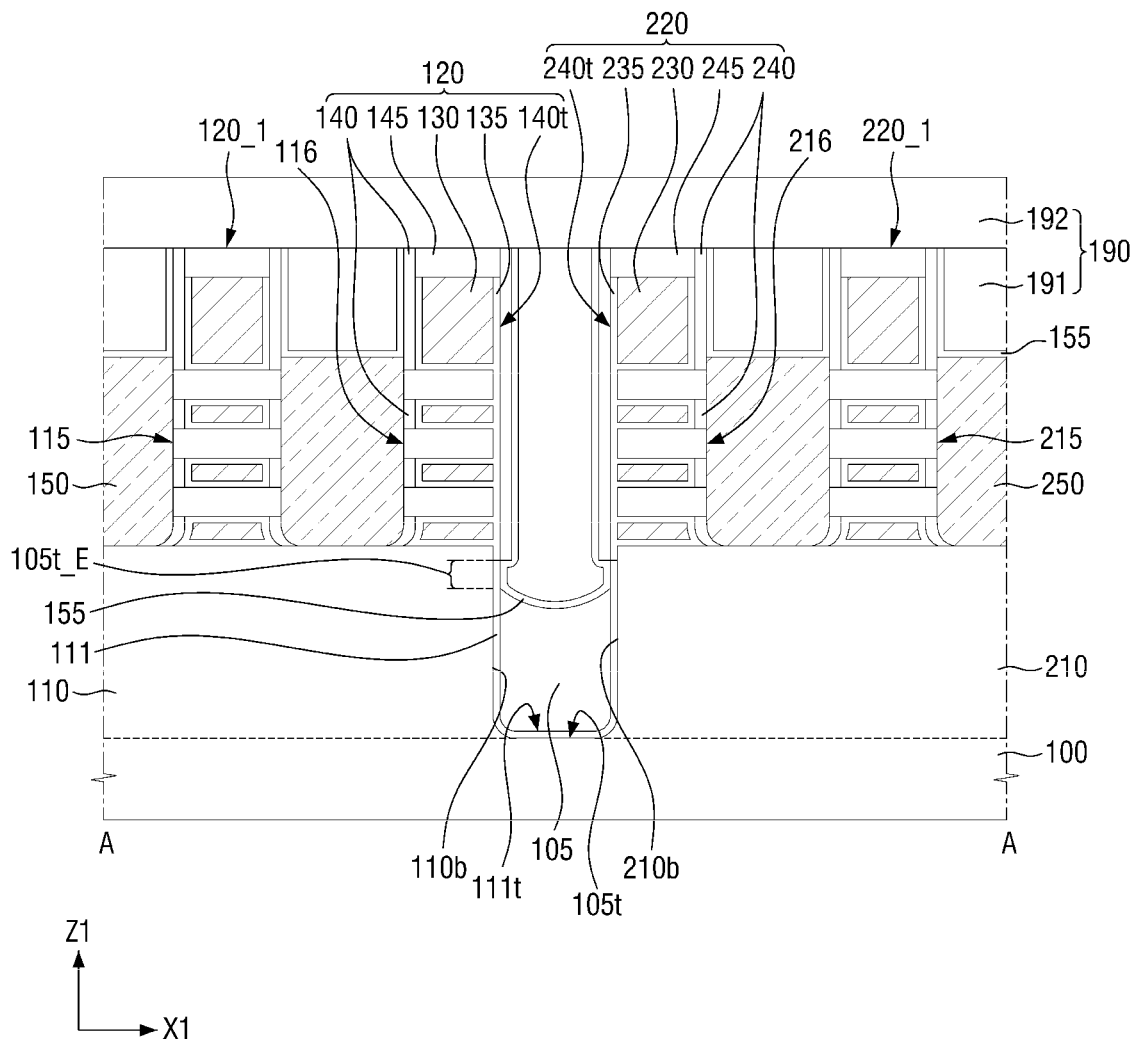
FIG. 8 is a view illustrating a semiconductor device, according to example embodiments of the inventive concept.

FIG. 8 is a view illustrating a semiconductor device according to example embodiments of the inventive concept. In FIG. 8, main differences between the present embodiment and the embodiments of FIGS. 1 to 6 will be described.

Referring to FIG. 8, in a semiconductor device according to example embodiments of the inventive concept, a portion of the first gate spacer 140 and a portion of the second gate spacer 240 may be disposed along the sidewall of the first fin-cut trench 105t. For example, a lower surface of the first gate spacer 140 and a lower surface of the second gate spacer 240 may be at lower vertical levels than upper surfaces of the first and second fin patterns 110 and 210.

The first fin liner 111 may be disposed on the short sidewall 110b of the first fin pattern 110 and the short sidewall 210b of the second fin pattern 210 defining a portion of the sidewall of the first fin-cut trench 105t. The first end gate structure 120 and the second end gate structure 220 may respectively be disposed on the short sidewall 110b of the first fin pattern 110 and the short sidewall 210b of the second fin pattern 210 defining the remainder of the sidewall of the first fin-cut trench 105t. In some embodiments, the first gate insulation layer 135 of the first end gate structure 120 may be disposed on the short sidewall 110b of the first fin pattern 110, and the second gate insulation layer 235 of the second end gate structure 220 may be disposed on the short sidewall 210b of the second fin pattern 210. In some embodiments, the first gate insulation layer 135 may be disposed between the first gate spacer 140 and the short sidewall 110b of the first fin pattern 110, and the second gate insulation layer 235 may be disposed between the second gate spacer 240 and the short sidewall 210b of the second fin pattern 210.

The first end gate structure 120 and the second end gate structure 220 may contact the first fin liner 111 disposed along the sidewall of the first fin-cut trench 105t.

Figure 9:
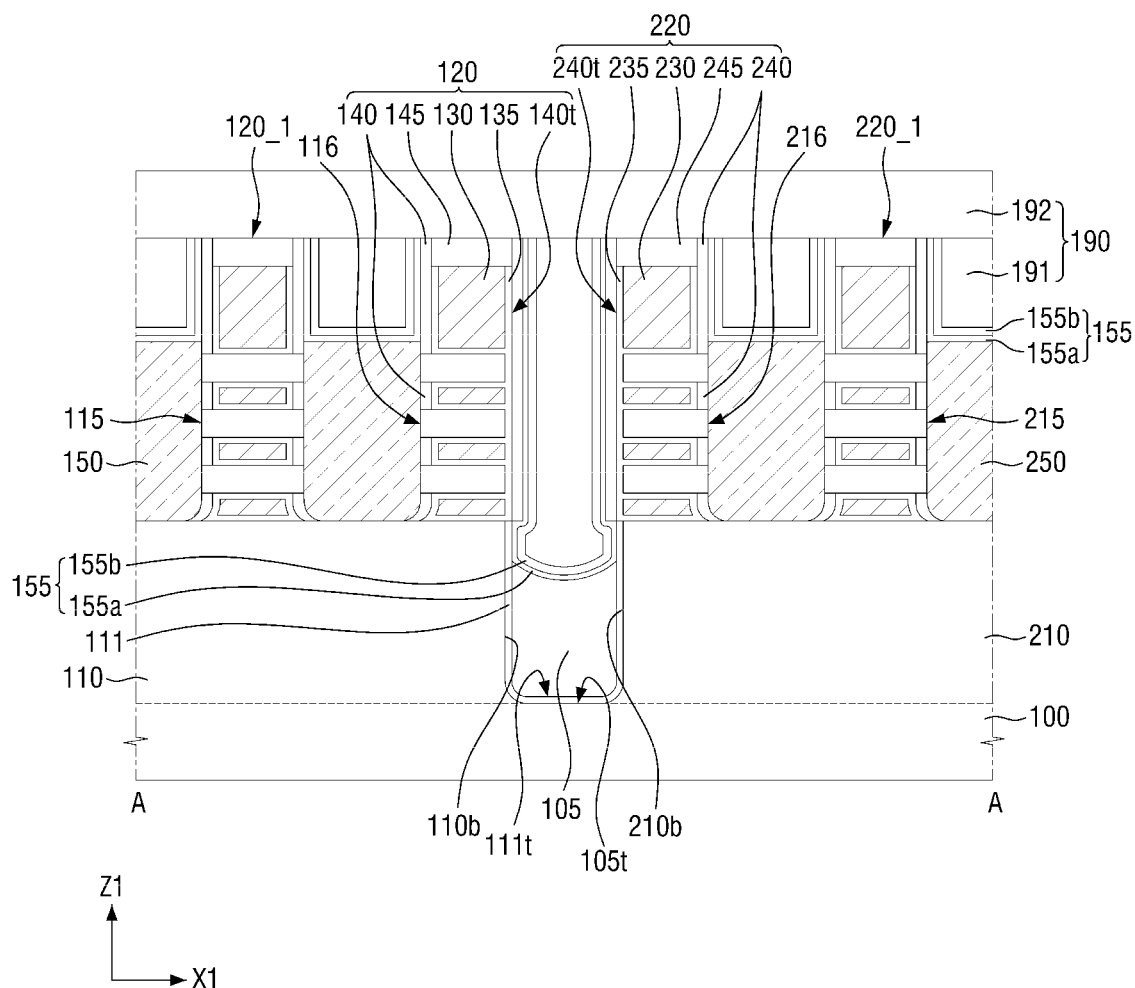
FIG. 9 is a view illustrating a semiconductor device, according to example embodiments of the inventive concept.

FIG. 9 is a view illustrating a semiconductor device according to example embodiments of the inventive concept. In FIG. 9, main differences between the present embodiment and the embodiments of FIGS. 1 to 6 will be described.

Referring to FIG. 9, in a semiconductor device according to example embodiments of the inventive concept, the first insulation liner 155 may include a first lower insulation liner 155a and a first upper insulation liner 155b.

The first lower insulation liner 155a may contact the first fin liner 111 along the portion of the exposed region 105t_E of the first fin-cut trench 105t. In addition, the first lower insulation liner 155a may contact an upper surface of the first field insulation layer 105, upper surfaces of the first epitaxial pattern 150 and the second epitaxial pattern 250, and side surfaces of the first gate spacers 140 and the second gate spacers 240. The first upper insulation liner 155b may be disposed on the first lower insulation liner 155a.

The first lower insulation liner 155a may include, for example, silicon oxycarbonitride (SiOCN). The first upper insulation liner 155b may include, for example, silicon nitride (SiN), silicon oxynitride (SiON), silicon oxide (SiO$_2$), or a combination thereof.

Figure 10:
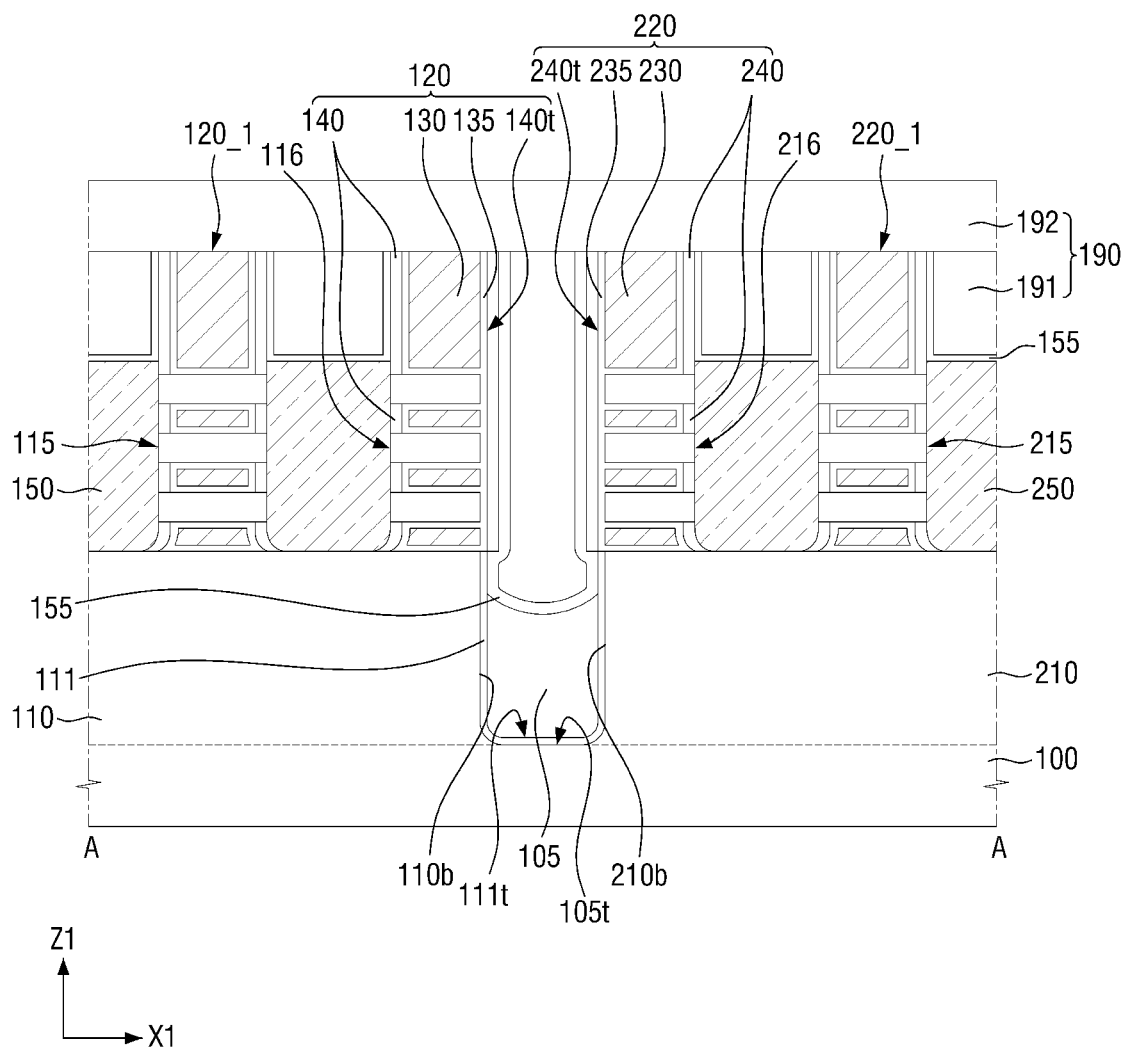
FIG. 10 is a view illustrating a semiconductor device, according to example embodiments of the inventive concept.

FIG. 10 is a view illustrating a semiconductor device according to example embodiments of the inventive concept. In FIG. 10, main differences between the present embodiment and the embodiments of FIGS. 1 to 6 will be described.

Referring to FIG. 10, in a semiconductor device according to example embodiments of the inventive concept, each of the first gate structures 120 and 120_1 and the second gate structures 220 and 220_1 may not include the capping pattern on the first and second gate electrodes 130 and 230.

In FIG. 10, since the first capping pattern (see, e.g., the first capping pattern 145 of FIG. 2) is not disposed on the first gate electrode 130 and the second capping pattern (see, e.g., the second capping pattern 245 of FIG. 2) is not disposed on the second gate electrode 230, an upper surface of the first gate electrode 130 and an upper surface of the second gate electrode 230 may be coplanar with the upper surface of the lower interlayer insulation layer 191.

Figure 11:
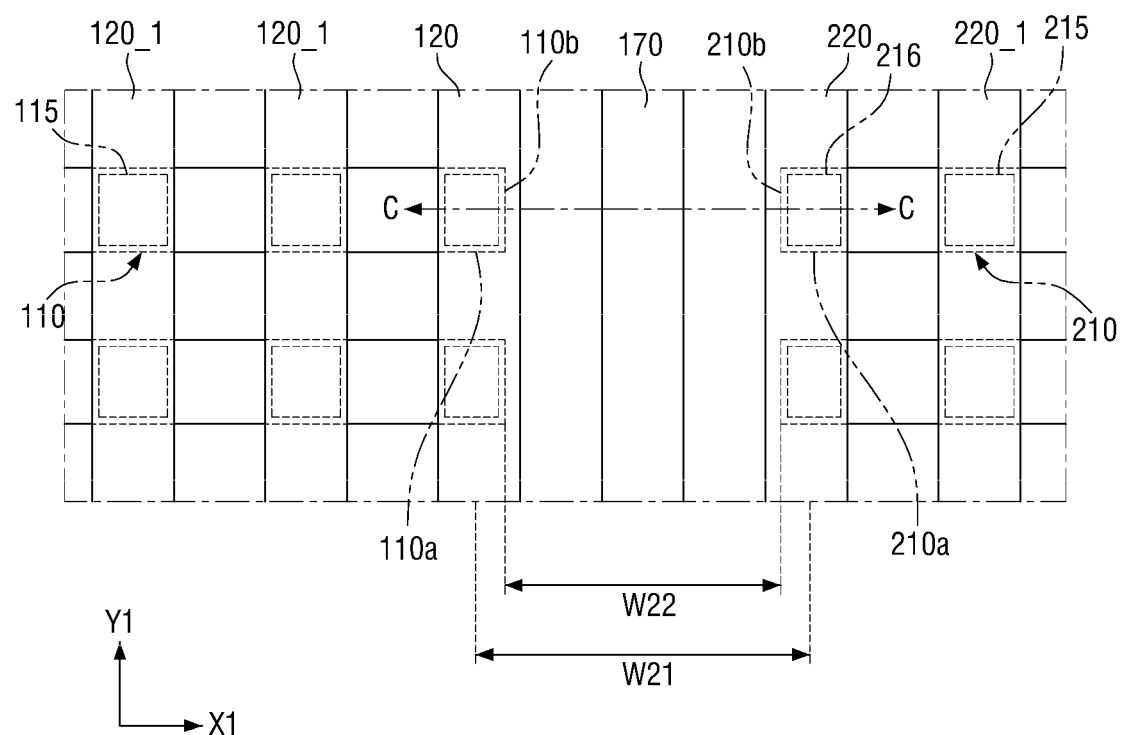
FIG. 11 is a plan view illustrating a semiconductor device, according to example embodiments of the inventive concept.
Figure 12:
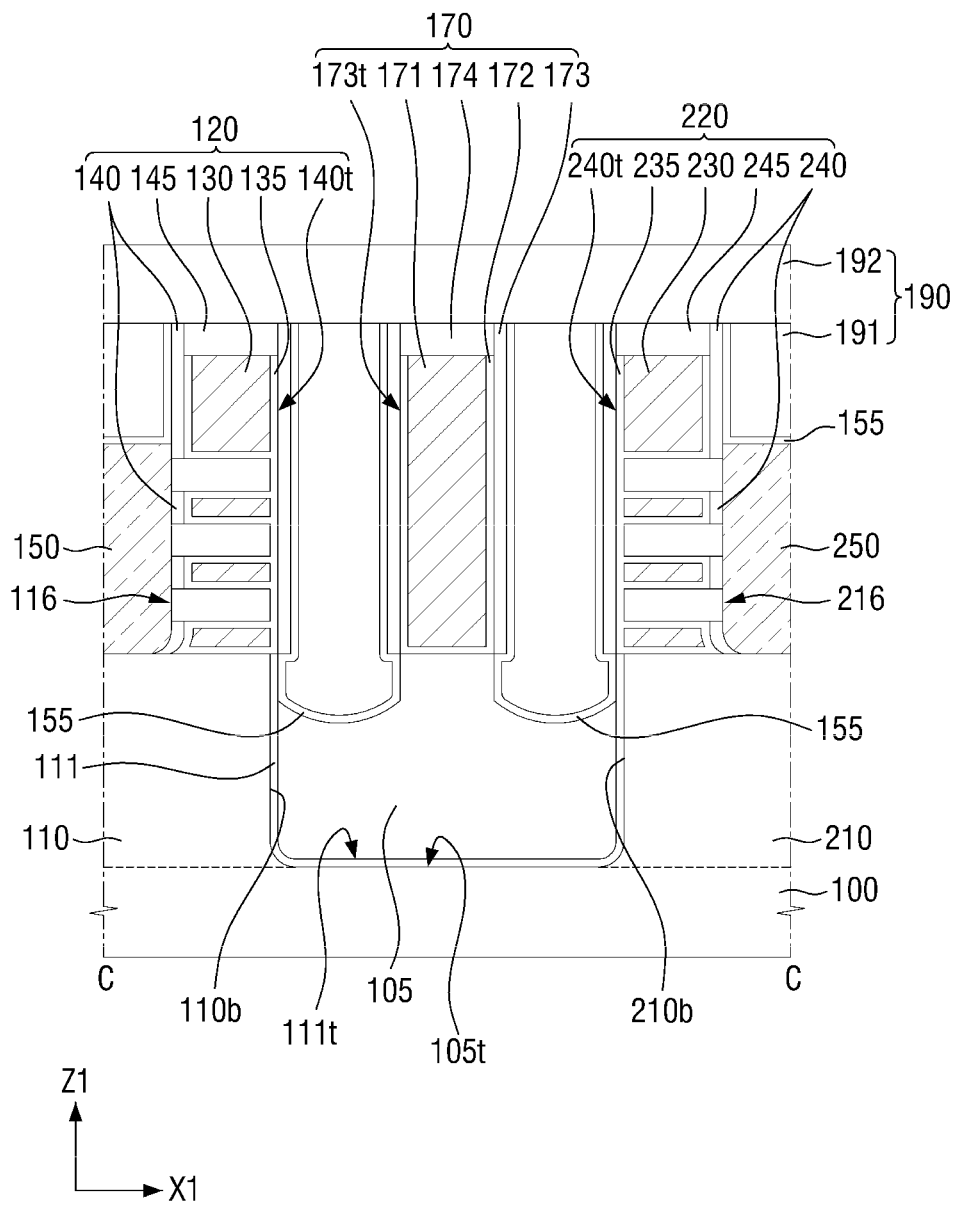
FIG. 12 is a cross-sectional view taken along line C-C of FIG. 11.

FIG. 11 is a plan view illustrating a semiconductor device according to example embodiments of the inventive concept. FIG. 12 is a cross-sectional view taken along line C-C of FIG. 11. In FIGS. 11 and 12, main differences between the present embodiment and the embodiments of FIGS. 1 to 6 will be described.

Referring to FIGS. 11 and 12, a semiconductor device according to example embodiments of the inventive concept may further include a dummy gate structure 170 disposed between the first end gate structure 120 and the second end gate structure 220, extending lengthwise in the second direction Y1. The lower interlayer insulation layer 191 may be disposed between the first end gate structure 120 and the dummy gate structure 170 and between the second end gate structure 220 and the dummy gate structure 170.

The dummy gate structure 170 may pass between the short sidewall 110b of the first fin pattern 110 and the short sidewall 210b of the second fin pattern 210. The dummy gate structure 170 may not cross the first fin pattern 110 and the second fin pattern 210. The dummy gate structure 170 may not overlap the first fin pattern 110 and the second fin pattern 210. For example, the dummy gate structure 170 may maintain a constant distance in the first direction X1 from the short sidewall 110b of the first fin pattern 110 and a constant distance in the first direction X1 from the short sidewall 210b of the second fin pattern 210.

The dummy gate structure 170 may be disposed on the first field insulation layer 105 in the first fin-cut trench 105t. The dummy gate structure 170 may be disposed on the upper surface of the first field insulation layer 105. The dummy gate structure 170 may be disposed on the first field insulation layer 105 between the first fin pattern 110 and the second fin pattern 210.

The dummy gate structure 170 may contact the upper surface of the first field insulation layer 105.

Since the dummy gate structure 170 does not cross the first fin pattern 110 or the second fin pattern 210, the first fin liner 111 extending along the sidewall and the bottom surface of the first fin-cut trench 105t may not contact the dummy gate structure 170.

An upper surface of a portion of the first field insulation layer 105 contacting the dummy gate structure 170 may be higher than an upper surface of another portion of the first field insulation layer 105 contacting the first fin liner 111 on the sidewall of the first fin-cut trench 105t. In the process of forming the first epitaxial pattern 150 and the second epitaxial pattern 250, the first field insulation layer 105 below the first end gate structure 120 and the second end gate structure 220 may partly be removed. Accordingly, a height of the upper surface of the first field insulation layer 105 below the dummy gate structure 170 may be greater than a height of the upper surface of the first field insulation layer 105 below the first end gate structure 120 and the second end gate structure 220 with respect to the upper surface of the substrate 100. In some embodiments, the upper surface of the first field insulation layer 105 below the dummy gate structure 170 may be at the same vertical level (e.g., in the third direction Z1) as upper surfaces of the first fin pattern 110 and the second fin pattern 210.

A distance between the center line of the first end gate structure 120 and the center line of the second end gate structure 220 with the dummy gate structure 170 therebetween may be a third distance W21. A distance between the first fin pattern 110 and the second fin pattern 210 with the dummy gate structure 170 therebetween may be a fourth distance W22. In some embodiments, the fourth distance W22 may be the distance between the short sidewall 110b of the first fin pattern 110 and the short sidewall 210b of the second fin pattern 210. As an example, the third distance W21 may be greater than the fourth distance W22.

The dummy gate structure 170 may include a dummy gate electrode 171, a dummy gate insulation layer 172, dummy gate spacers 173, a dummy gate trench 173t, and a dummy capping pattern 174.

The dummy gate spacers 173 may extend lengthwise in the second direction Y1. The dummy gate spacers 173 may define the dummy gate trench 173t.

The dummy gate insulation layer 172 may extend along a bottom surface and a sidewall of the dummy gate trench 173t. The dummy gate insulation layer 172 may contact the upper surface of the first field insulation layer 105 below the dummy gate structure 170.

The dummy gate electrode 171 may be disposed between the dummy gate spacers 173. The dummy gate electrode 171 may be disposed on the dummy gate insulation layer 172. An upper surface of the dummy gate electrode 171 may be coplanar with an upper surface of the dummy gate insulation layer 172. The dummy gate electrode 171 may partly fill the dummy gate trench 173t.

The dummy capping pattern 174 may be disposed on the dummy gate electrode 171. The dummy capping pattern 174 may contact the upper surface of the dummy gate insulation layer 172. The dummy capping pattern 174 may fill the remainder of the dummy gate trench 173t having the dummy gate electrode 171. An upper surface of the dummy capping pattern 174 may be coplanar with upper surfaces of the dummy gate spacers 173 and the lower interlayer insulation layer 191.

Figure 13:
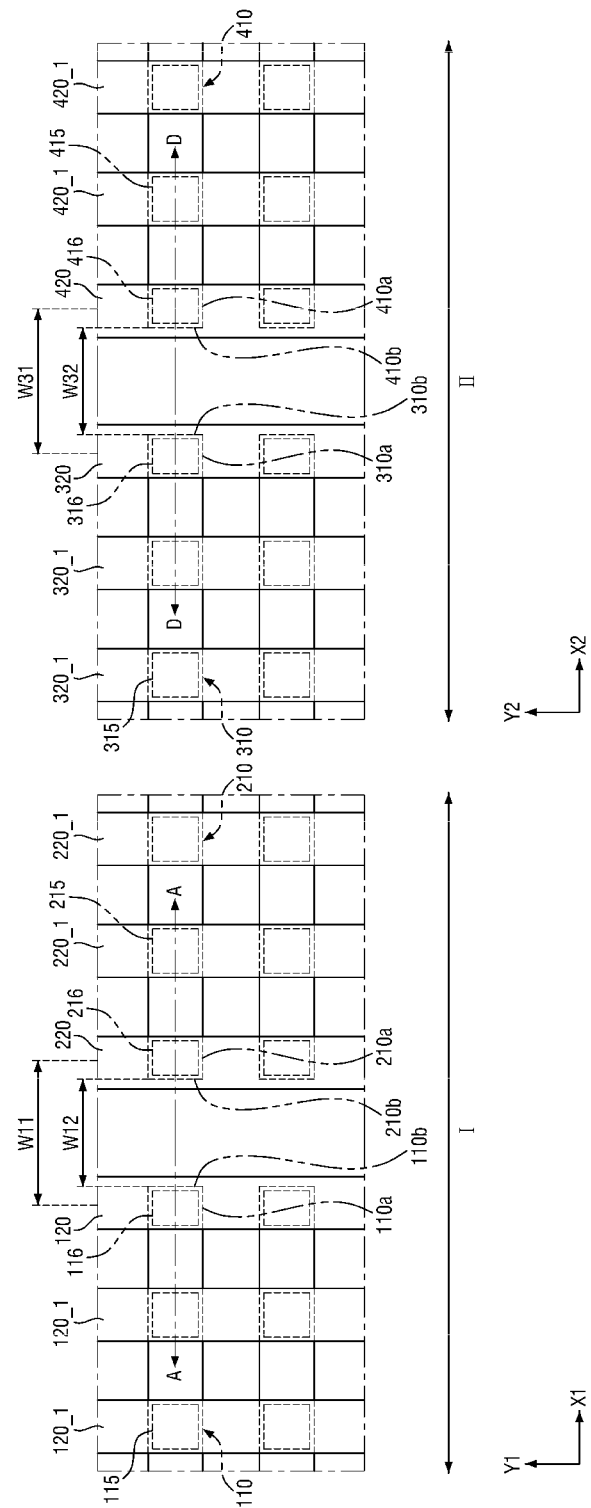
FIG. 13 is a plan view illustrating a semiconductor device, according to example embodiments of the inventive concept.
Figure 14:
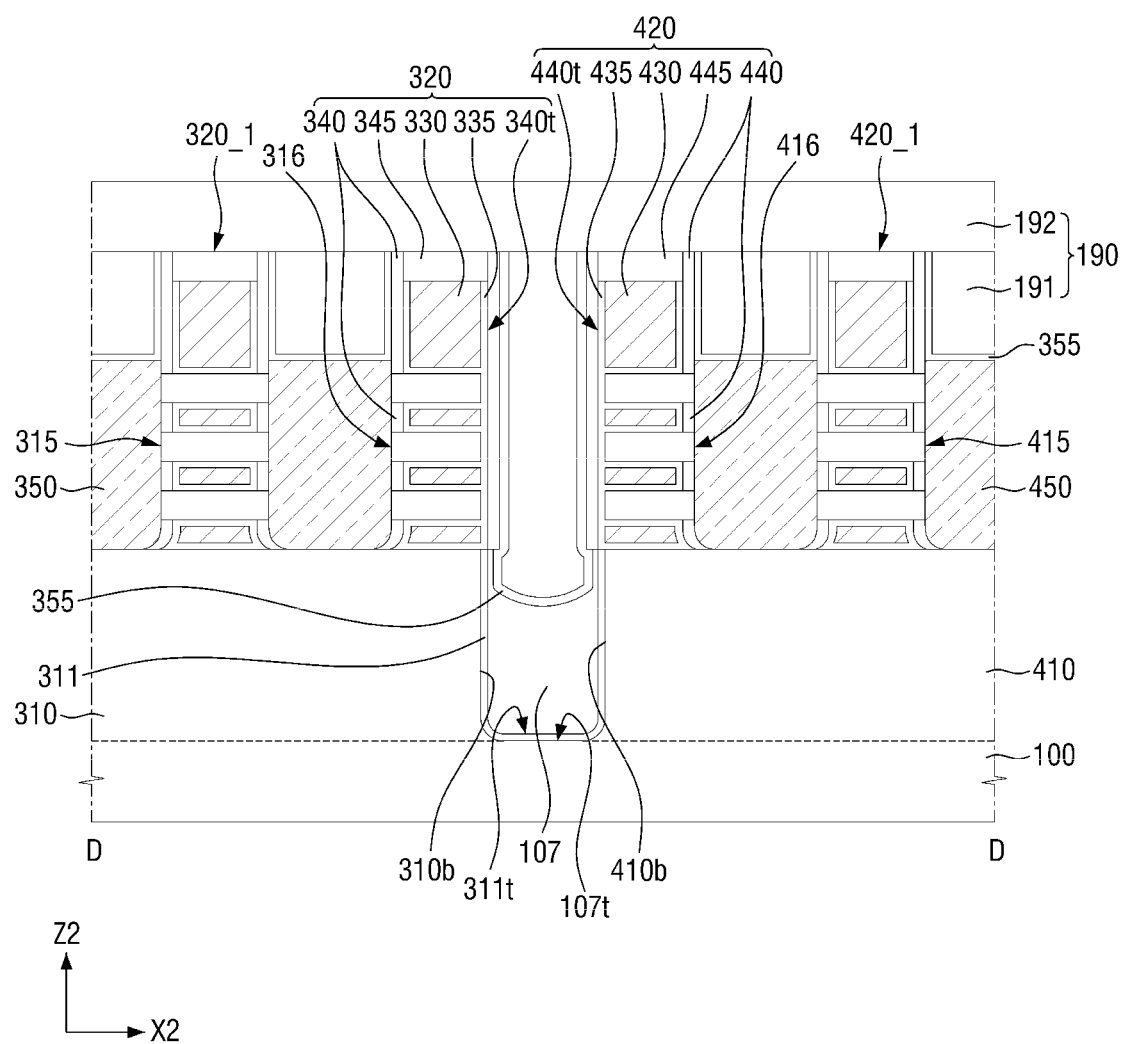
FIG. 14 is a cross-sectional view taken along line D-D of FIG. 13.
Figure 15:
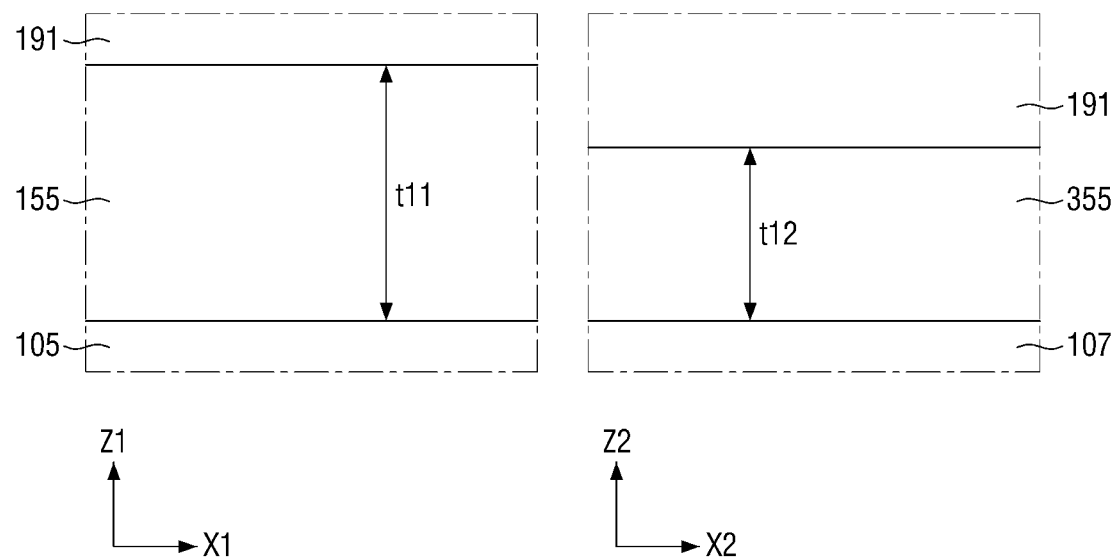
FIG. 15 is a view for comparing a thickness of a first insulation liner in a first region I of FIG. 13 with a thickness of a second insulation liner in a second region II of FIG. 13.

FIG. 13 is a plan view illustrating a semiconductor device according to example embodiments of the inventive concept. FIG. 14 is a cross-sectional view taken along line D-D of FIG. 13. FIG. 15 is a view for comparing a thickness of a first insulation liner in a first region I of FIG. 13 with a thickness of a second insulation liner in a second region II of FIG. 13.

A cross-sectional view taken along line A-A of FIG. 13 may be substantially the same as one of the views of FIGS. 2, 7, and 8.

In addition, the first fin pattern 110, the second fin pattern 210, the first normal nanosheets 115, the first dummy nanosheets 116, the second normal nanosheets 215, the second dummy nanosheets 216, the first gate structures 120 and 120_1, the second gate structures 220 and 220_1, the first fin liner 111, and the first insulation liner 155 as shown in a first region I of FIG. 13 and the cross-sectional view taken along line A-A of FIG. 13 may be substantially the same as described with reference to FIGS. 1 to 8. Accordingly, descriptions of FIGS. 13 to 15 will be mainly made with reference to contents shown in a second region II.

Referring to FIGS. 13 to 15, a semiconductor device according to example embodiments of the inventive concept may include the first fin pattern 110, the second fin pattern 210, a third fin pattern 310, a fourth fin pattern 410, the first normal nanosheets 115, the first dummy nanosheets 116, the second normal nanosheets 215, the second dummy nanosheets 216, third normal nanosheets 315, third dummy nanosheets 316, fourth normal nanosheets 415, fourth dummy nanosheets 416, the first gate structures 120 and 120_1, the second gate structures 220 and 220_1, third gate structures 320 and 320_1, fourth gate structures 420 and 420_1, the first fin liner 111, a second fin liner 311, the first insulation liner 155, and a second insulation liner 355.

The substrate 100 may include the first region I and the second region II. The first region I may be a PMOS region. The second region II may be an NMOS region.

Each of the first normal nanosheets 115 and the second normal nanosheets 215 in the first region I may be utilized as a channel region of a PMOS transistor. For example, the first normal nanosheets 115 may be utilized as one channel region of a PMOS transistor, and the second normal nanosheets 215 may be utilized as another channel region of a PMOS transistor. Each of the third normal nanosheets 315 and the fourth normal nanosheets 415 in the second region II may be utilized as a channel region of an NMOS transistor. For example, the third normal nanosheets 315 may be utilized as one channel region of an NMOS transistor, and the fourth normal nanosheets 415 may be utilized as another channel region of an NMOS transistor.

The third fin pattern 310 and the fourth fin pattern 410 may protrude from the substrate 100 (e.g., in a sixth direction Z2, which is perpendicular to a fourth direction X2 and a fifth direction Y2). Each of the third fin pattern 310 and the fourth fin pattern 410 may extend lengthwise in the fourth direction X2. For example, the third fin pattern 310 and the fourth fin pattern 410 may have long sidewalls 310a and 410a, respectively, extending in the fourth direction X2, and short sidewalls 310b and 410b, respectively, extending in the fifth direction Y2. The fourth direction X2 and the fifth direction Y2 may be perpendicular to each other and may be parallel to the upper surface of the substrate 100. In some embodiments, the first direction X1, the second direction Y1, and the third direction Z1 may be the same directions as the fourth direction X2, the fifth direction Y2, and the sixth direction Z2, respectively. In other embodiments, the first direction X1, the second direction Y1, and the third direction Z1 may be different from the fourth direction X2, the fifth direction Y2, and the sixth direction Z2, respectively.

The third fin pattern 310 and the fourth fin pattern 410 may be arranged in the fourth direction X2 that is a length direction thereof. The third fin pattern 310 may be spaced apart from the fourth fin pattern 410 in the fourth direction X2. For example, the third fin pattern 310 and the fourth fin pattern 410 may be arranged in a row in the fourth direction X2. Upper surfaces of the third fin pattern 310 and the fourth fin pattern 410 may be coplanar with one another.

The short sidewall 310b of the third fin pattern 310 may face the short sidewall 410b of the fourth fin pattern 410. The third fin pattern 310 and the fourth fin pattern 410 may be separated by a second fin-cut trench 107t. The short sidewall 310b of the third fin pattern 310 and the short sidewall 410b of the fourth fin pattern 410 may be defined by the second fin-cut trench 107t.

Each of the third fin pattern 310 and the fourth fin pattern 410 may be formed by etching a portion of the substrate 100 or may include an epitaxial layer grown from the substrate 100. Each of the third fin pattern 310 and the fourth fin pattern 410 may include a semiconductor material, for example, silicon (Si) or germanium (Ge). In some embodiments, each of the third fin pattern 310 and the fourth fin pattern 410 may include a compound semiconductor, for example, a group IV-IV compound semiconductor or a group III-V compound semiconductor.

The third fin pattern 310 and the fourth fin pattern 410 may include the same material. In some embodiments, each of the third fin pattern 310 and the fourth fin pattern 410 may be a silicon fin pattern including silicon.

The second fin liner 311 may extend along at least a portion of a sidewall and a bottom surface of the second fin-cut trench 107t. In some embodiments, the second fin liner 311 may be disposed on the whole sidewall of the second fin-cut trench 107t.

The second fin liner 311 may have a lower surface facing the third fin pattern 310 and the fourth fin pattern 410 and an upper surface opposite to the lower surface. For example, the lower surface of the second fin liner 311 may contact the third fin pattern 310 and the fourth fin pattern 410, and the upper surface of the second fin liner 311 may contact the third field insulation layer 107. Since the second fin liner 311 extends along the surface of the second fin-cut trench 107t, a second liner trench 311t may be defined by the upper surface of the second fin liner 311.

The second fin liner 311 may include, for example, silicon oxynitride, silicon nitride, and/or silicon oxide.

A third field insulation layer 107 may fill a portion of the second fin-cut trench 107t. The third field insulation layer 107 may be disposed on the short sidewall 310b of the third fin pattern 310 and on the short sidewall 410b of the fourth fin pattern 410.

The third field insulation layer 107 may fill at least a portion of the second liner trench 311t. The third field insulation layer 107 may cover the second fin liner 311 extending along the sidewall of the second fin-cut trench 107t. In some embodiments, the second fin liner 311 may be disposed between the third field insulation layer 107 and the third fin pattern 310 and between the third field insulation layer 107 and the fourth fin pattern 410. For example, the second fin liner 311 may contact the short sidewall 310b of the third fin pattern 310, the short sidewall 410b of the fourth fin pattern 410, and an upper surface of the substrate 100, and the third field insulation layer 107 may contact the second fin liner 311.

Third nanosheets 315 and 316 may be disposed on the substrate 100. The third nanosheets 315 and 316 may be disposed on the third fin pattern 310. The third nanosheets 315 and 316 may include the third normal nanosheets 315 and the third dummy nanosheets 316.

A third epitaxial pattern 350 may be disposed between the third nanosheets 315 and 316 spaced apart from each other in the fourth direction X2. The third dummy nanosheets 316 may be connected to one third epitaxial pattern 350. For example, the third dummy nanosheets 316 may be disposed next to one third epitaxial pattern 350 and may contact the one third epitaxial pattern 350. The third normal nanosheets 315 may be connected to two third epitaxial patterns 350 disposed at opposite sides of the third normal nanosheets 315 in the fourth direction X2. For example, the third normal nanosheets 315 may be disposed between two third epitaxial patterns 350 and may contact the two third epitaxial patterns 350.

Fourth nanosheets 415 and 416 may be disposed on the substrate 100. The fourth nanosheets 415 and 416 may be disposed on the fourth fin pattern 410. The fourth nanosheets 415 and 416 may include the fourth normal nanosheets 415 and the fourth dummy nanosheets 416.

A fourth epitaxial pattern 450 may be disposed between the fourth nanosheets 415 and 416, which are spaced apart from each other in the fourth direction X2. The fourth dummy nanosheets 416 may be connected to one fourth epitaxial pattern 450. For example, the fourth dummy nanosheets 416 may be disposed next to one fourth epitaxial pattern 450 and may contact the one fourth epitaxial pattern 450. The fourth normal nanosheets 415 may be connected to two fourth epitaxial patterns 450 disposed at opposite sides of the fourth normal nanosheets 415 in the fourth direction X2. For example, the fourth dummy nanosheets 416 may be disposed between two fourth epitaxial patterns 450 and may contact the two fourth epitaxial patterns 450.

Each of the third nanosheets 315 and 316 and the fourth nanosheets 415 and 416 may include a semiconductor material, for example, silicon or germanium. In some embodiments, each of the third nanosheets 315 and 316 and the fourth nanosheets 415 and 416 may include a compound semiconductor, for example, a group IV-IV compound semiconductor or a group III-V compound semiconductor.

The third nanosheets 315 and 316 may include the same material as corresponding ones of the fourth nanosheets 415 and 416 at the same height level.

Each of the third gate structures 320 and 320_1 may extend lengthwise in the fifth direction Y2. The third gate structures 320 and 320_1 may cross the third fin pattern 310. The third gate structures 320 and 320_1 may include a third end gate structure 320 and a third normal gate structure 320_1. The third end gate structure 320 may overlap an end portion of the third fin pattern 310. The third end gate structure 320 may overlap the short sidewall 310b of the third fin pattern 310. For example, the third end gate structure 320 may extend beyond the short sidewall 310b of the third fin pattern 310 in the fourth direction X2.

The third gate structures 320 and 320_1 may traverse the third nanosheets 315 and 316, respectively, which are spaced apart from each other in the fourth direction X2. The third normal gate structure 320_1 may surround the third normal nanosheets 315. The third end gate structure 320 may surround the third dummy nanosheets 316.

Each of the fourth gate structures 420 and 4201 may extend in the fifth direction Y2. The fourth gate structures 420 and 420_1 may cross the fourth fin pattern 410. The fourth gate structures 420 and 420_1 may include a fourth end gate structure 420 and a fourth normal gate structure 420_1. The fourth end gate structure 420 may overlap an end portion of the fourth fin pattern 410. The fourth end gate structure 420 may overlap the short sidewall 410b of the fourth fin pattern 410. For example, the fourth end gate structure 420 may extend beyond the short sidewall 410b of the fourth fin pattern 410 in the negative fourth direction X2.

The fourth gate structures 420 and 4201 may traverse the fourth nanosheets 415 and 416, respectively, which are spaced apart from each other in the fourth direction X2. The fourth normal gate structure 420_1 may surround the fourth normal nanosheets 415. The fourth end gate structure 420 may surround the fourth dummy nanosheets 416.

In some embodiments, the third end gate structure 320 and the fourth end gate structure 420 may contact the third field insulation layer 107 that is disposed between the short sidewall 310b of the third fin pattern 310 and the short sidewall 410b of the fourth fin pattern 410.

A distance from a center line of the third end gate structure 320 to a center line of the fourth end gate structure 420 may be a fifth distance W31. A distance between the third fin pattern 310 and the fourth fin pattern 410 separated by the second fin-cut trench 107t may be a sixth distance W32. In some embodiments, the sixth distance W32 may be the distance between the short sidewall 310b of the third fin pattern 310 and the short sidewall 410b of the fourth fin pattern 410.

In some embodiments, the fifth distance W31 may be greater than the sixth width W32. For example, a pitch between adjacent ones of the third gate structures 320 and 320_1 and the fourth gate structures 420 and 420_1 may be greater than a separation width between the third fin pattern 310 and the fourth fin pattern 410 that are adjacent to each other.

Each of the third gate structures 320 and 320_1 may include a third gate electrode 330, a third gate insulation layer 335, third gate spacers 340, a third gate trench 340t, and a third capping pattern 345. Each of the fourth gate structures 420 and 420_1 may include a fourth gate electrode 430, a fourth gate insulation layer 435, fourth gate spacers 440, a fourth gate trench 440t, and a fourth capping pattern 445.

A third epitaxial pattern 350 may be disposed between the adjacent third gate structures 320 and 320_1. The third epitaxial pattern 350 may be disposed on the third fin pattern 310. A fourth epitaxial pattern 450 may be disposed between the adjacent fourth gate structures 420 and 420_1. The fourth epitaxial pattern 450 may be disposed on the fourth fin pattern 410.

The second insulation liner 355 may be formed along a profile of the third epitaxial pattern 350, a profile of the fourth epitaxial pattern 450, outer sidewalls of the third gate spacers 340, outer sidewalls of the fourth gate spacers 440, and an upper surface of the third field insulation layer 107.

In some embodiments, the second insulation liner 355 may not contact the second fin liner 311. A portion of the third field insulation layer 307 may be disposed between the second insulation liner 355 and the second fin liner 311. For example, the third field insulation layer 307 may contact lower surfaces of the third gate spacers 340 and the fourth gate spacers 440.

The second insulation liner 355 may include, for example, silicon nitride (SiN), silicon oxynitride (SiON), silicon oxide ($SiO_2$), silicon carbonitride (SiCN), silicon oxycarbonitride (SiOCN), or a combination thereof. The second insulation liner 355 may include a material having an etch selectivity with respect to the lower interlayer insulation layer 191.

Referring to FIG. 15, the first insulation liner 155 may have a thickness that is a distance from a lower surface of the first insulation liner 155 to an upper surface of the first insulation liner 155, and the second insulation liner 355 may have a thickness that is a distance from a lower surface of the second insulation liner 355 to an upper surface of the second insulation liner 355. In some embodiments, the thickness of the first insulation liner 155 may be the same throughout the first region I, and the thickness of the second insulation liner 355 may be the same throughout the second region II. As shown in FIG. 15, in the first region I, a thickness of the first insulation liner 155 between the first field insulation layer 105 and the lower interlayer insulation layer 191 may be a first thickness t1. In the second region II, a thickness of the second insulation liner 355 between the third field insulation layer 107 and the lower interlayer insulation layer 191 may be a second thickness t12. For example, the first thickness t11 may be greater than the second thickness t12.

Figure 16:
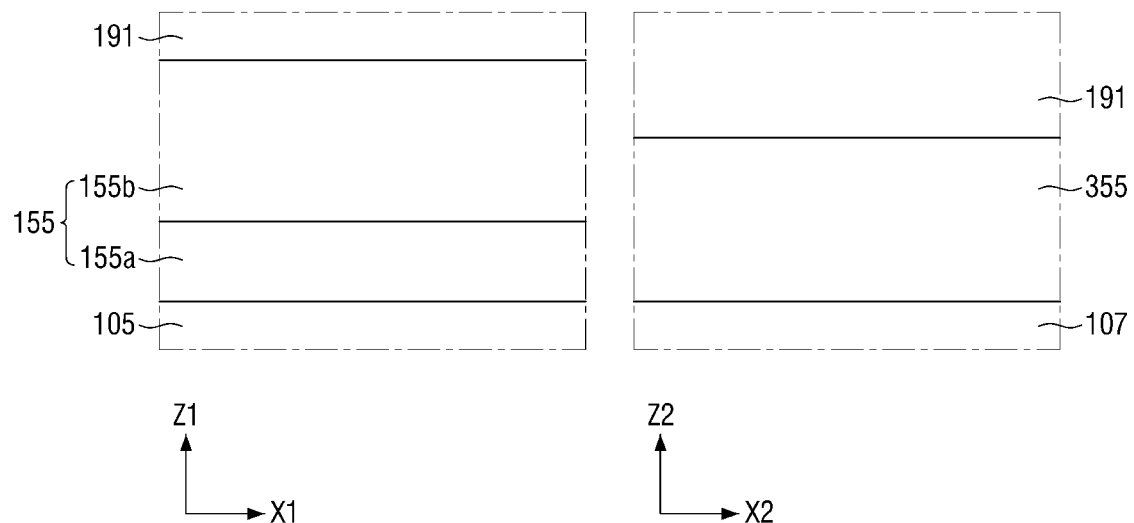
FIG. 16 is a view illustrating a semiconductor device, according to example embodiments of the inventive concept.

FIG. 16 is a view illustrating a semiconductor device according to example embodiments of the inventive concept. A main difference between the present embodiment and the embodiments of FIGS. 13 to 15 will be described. FIG. 16 is a view for comparing a first insulation liner in a first region I to a second insulation liner in a second region II.

Referring to FIG. 16, in a semiconductor device according to example embodiments of the inventive concept, the first insulation liner 155 may include the first lower insulation liner 155a and the first upper insulation liner 155b that are sequentially stacked on the first fin liner 111.

A material included in the second insulation liner 355 may be the same as a material included in the first upper insulation liner 155b. For example, the first upper insulation liner 155b and the second insulation liner 355 may be a film formed in the same manufacturing process.

A thickness of the first insulation liner 155 may be greater than a thickness of the second insulation liner 355.

Figure 17:
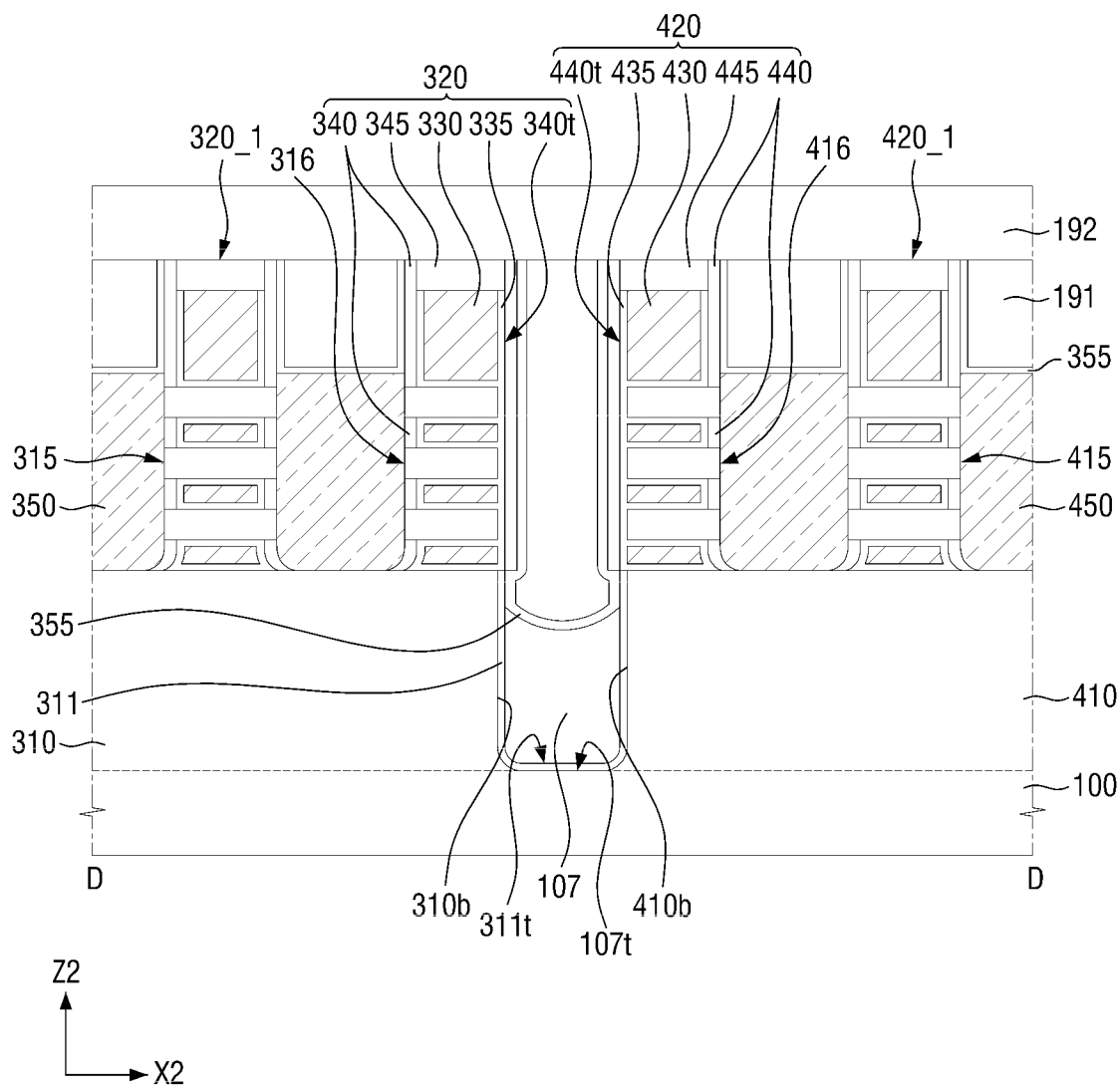
FIG. 17 is a view illustrating a semiconductor device, according to example embodiments of the inventive concept.

FIG. 17 is a view illustrating a semiconductor device according to example embodiments of the inventive concept. In FIG. 17, main differences between the present embodiment and the embodiments of FIGS. 13 to 15 will be described.

Referring to FIG. 17, in a semiconductor device according to example embodiments of the inventive concept, the third field insulation layer 107 may not cover a portion of the second fin liner 311 extending along the sidewall of the second fin-cut trench 107t.

A portion of the second fin liner 311 may protrude above an upper surface of the third field insulation layer 107 with respect to the bottom surface of the second fin-cut trench 107t.

In some embodiments, the third end gate structure 320 and the fourth end gate structure 420 may not contact the third field insulation layer 107 between the short sidewall 310b of the third fin pattern 310 and the short sidewall 410b of the fourth fin pattern 410.

The second insulation liner 355 may contact the second fin liner 311 between the third gate spacer 340 and the third field insulation layer 107 and between the fourth gate spacer 440 and the third field insulation layer 107. The second insulation liner 355 may contact the second fin liner 311 between the third end gate structure 320 and the third field insulation layer 107 and between the fourth end gate structure 420 and the third field insulation layer 107.

A portion of the second insulation liner 355 may be disposed between the third gate spacer 340 and the upper surface of the third field insulation layer 107, such that the third gate spacer 340 may not contact the third field insulation layer 107. A portion of the second insulation liner 355 may be disposed between the fourth gate spacer 440 and the upper surface of the third field insulation layer 107, such that the fourth gate spacer 440 may not contact the third field insulation layer 107.

While the present inventive concepts have been particularly shown and described with reference to example embodiment. While the present inventive concepts have been particularly shown and described with reference to example embodiments thereof, it will be understood by those of ordinary skill in the art that various changes in form and details may be made therein without departing from the spirit and scope of the present disclosure as defined by the following claims.

What is claimed is:

1. A semiconductor device comprising:
   a first fin pattern and a second fin pattern separated by a fin trench, each of the first fin pattern and the second fin pattern extending lengthwise in a first direction;
   a first nanosheet disposed on the first fin pattern;
   a second nanosheet disposed on the second fin pattern;
   a fin liner extending along at least a portion of a sidewall and a bottom surface of the fin trench;
   a field insulation layer disposed on the fin liner and filling a portion of the fin trench;
   a first gate structure overlapping an end portion of the first fin pattern;
   a dummy gate structure on the field insulating layer and spaced apart from the first gate structure in the first direction; and
   a first interlayer insulation layer between the first gate structure and the dummy gate structure,
   wherein a height from the bottom surface of the fin trench to a lower surface of the dummy gate structure is greater than a height from the bottom surface of the fin trench to a lower surface of the first interlayer insulation layer,
   wherein the first interlayer insulation layer includes a first portion overlapping the field insulation layer in the first direction, and a second portion on the first portion,
   wherein the second portion of the first interlayer insulation layer overlaps the dummy gate structure in the first direction, and
   wherein a maximum width of the first portion of the first interlayer insulation layer is greater than a maximum width of the second portion of the first interlayer insulation layer.

2. The semiconductor device of claim 1, wherein the lower surface of the dummy gate structure is in contact with the field insulation layer.

3. The semiconductor device of claim 1, wherein the lower surface of the dummy gate structure is on the same level as a lower surface of the first gate structure.

4. The semiconductor device of claim 1, wherein the fin liner is not in contact with the dummy gate structure.

5. The semiconductor device of claim 1, wherein the maximum width of the first portion of the first interlayer insulation layer includes a portion that increases from the lower surface of the dummy gate structure to the bottom surface of the fin trench.

6. The semiconductor device of claim 1,
   wherein the dummy gate structure includes a dummy gate insulation layer that defines a recess and a dummy gate electrode on the dummy gate insulation layer, and
   wherein the dummy gate electrode completely fills the recess.

7. The semiconductor device of claim 6, wherein at least a portion of the dummy gate electrode overlaps the first nanosheet in the first direction.

8. The semiconductor device of claim 1, further comprising:
a second gate structure overlapping an end portion of the second fin pattern, and
a second interlayer insulation layer between the second gate structure and the dummy gate structure,
wherein the height from the bottom surface of the fin trench to the lower surface of the dummy gate structure is greater than a height from the bottom surface of the fin trench to a lower surface of the second interlayer insulation layer.

9. The semiconductor device of claim 8,
wherein the second interlayer insulation layer includes a first portion overlapping the field insulation layer in the first direction, and a second portion on the first portion,
wherein the second portion of the second interlayer insulation layer overlaps the dummy gate structure in the first direction, and
wherein a maximum width of the first portion of the second interlayer insulation layer is greater than a maximum width of the second portion of the second interlayer insulation layer.

10. The semiconductor device of claim 1, further comprising:
an insulation liner extending along an outer sidewall of a first gate spacer and an outer sidewall of a dummy gate spacer,
wherein the insulation liner is in contact with the fin liner.

11. A semiconductor device comprising:
a first fin pattern and a second fin pattern separated by a fin trench, each of the first fin pattern and the second fin pattern extending lengthwise in a first direction;
a first nanosheet disposed on the first fin pattern;
a second nanosheet disposed on the second fin pattern;
a fin liner extending along at least a portion of a sidewall and a bottom surface of the fin trench;
a field insulation layer disposed on the fin liner and filling a portion of the fin trench;
a first gate structure overlapping an end portion of the first fin pattern;
a second gate structure overlapping an end portion of the second fin pattern;
a dummy gate structure on the field insulating layer and disposed between the first gate structure and the second gate structure;
a first interlayer insulation layer between the first gate structure and the dummy gate structure; and
a second interlayer insulation layer between the second gate structure and the dummy gate structure,
wherein the dummy gate structure includes a dummy gate insulation layer extending along a bottom surface and a sidewall of a dummy gate trench, and a dummy gate electrode on the dummy gate insulating layer,
wherein the dummy gate electrode completely fills a recess defined by the dummy gate insulation layer,
wherein a height from the bottom surface of the fin trench to a lower surface of the dummy gate structure is greater than a height from the bottom surface of the fin trench to a lower surface of the first interlayer insulation layer,
wherein the first interlayer insulation layer includes a first portion overlapping the field insulation layer in the first direction, and a second portion on the first portion, and
wherein the second portion of the first interlayer insulation layer overlaps the dummy gate structure in the first direction, and
wherein a maximum width of the first portion of the first interlayer insulation layer is greater than a maximum width of the second portion of the first interlayer insulation layer.

12. The semiconductor device of claim 11, wherein the fin liner is not in contact with the dummy gate structure.

13. The semiconductor device of claim 11, wherein the maximum width of the first portion of the first interlayer insulation layer includes a portion that increases from the lower surface of the dummy gate structure to the bottom surface of the fin trench.

14. The semiconductor device of claim 11, further comprising:
a first insulation liner extending along an outer sidewall of a first gate spacer, and an outer sidewall of a dummy gate spacer, and
a second insulation liner extending along an outer sidewall of a second gate spacer and an outer sidewall of the dummy gate spacer,
wherein the first insulation liner and the second insulation liner are in contact with the fin liner.

15. A semiconductor device comprising:
a substrate including a first region and a second region;
a first fin pattern and a second fin pattern on the first region of the substrate, the first fin pattern and the second fin pattern is-separated by a first trench, and each of the first fin pattern and the second fin pattern extending lengthwise in a first direction;
a first nanosheet disposed on the first fin pattern;
a second nanosheet disposed on the second fin pattern;
a first liner extending along at least a portion of a sidewall and a bottom surface of the first trench;
a first field insulation layer disposed on the first liner and filling a portion of the first trench;
a first gate structure overlapping an end portion of the first fin pattern and including a first gate spacer;
a third fin pattern and a fourth fin pattern on the second region of the substrate, the third fin pattern and the fourth fin pattern is separated by a second trench, and each of the third fin pattern and the fourth fin pattern extending lengthwise in the first direction;
a third nanosheet disposed on the third fin pattern;
a fourth nanosheet disposed on the fourth fin pattern;
a second liner extending along at least a portion of a sidewall and a bottom surface of the second trench;
a second field insulation layer disposed on the second liner and filling a portion of the second trench; and
a second gate structure overlapping an end portion of the third fin pattern and including a second gate spacer,
wherein the first gate spacer is not in contact with the first field insulation layer,
wherein the second gate spacer is in contact with the second field insulation layer,
wherein a height from the bottom surface of the first trench to a lower surface of the first gate spacer is greater than a height from the bottom surface of the first trench to an upper surface of the first field insulation layer,
wherein the first interlayer insulation layer includes a first portion overlapping the field insulation layer in the first direction, and a second portion on the first portion, and
wherein the second portion of the first interlayer insulation layer overlaps the dummy gate structure in the first direction, and wherein a maximum width of the first portion of the first interlayer insulation layer is greater than a maximum width of the second portion of the first interlayer insulation layer.

16. The semiconductor device of claim 15, further comprising:
a first insulation liner extending along an outer sidewall of the first gate spacer and the upper surface of the first field insulation layer, and
a second insulation liner extending along an outer sidewall of the second gate spacer and an upper surface of the second field insulation layer,
wherein a thickness of the first insulation liner is greater than a thickness of the second insulation liner.

17. The semiconductor device of claim 15, further comprising:
a first insulation liner extending along an outer sidewall of the first gate spacer and the upper surface of the first field insulation layer, and
a second insulation liner extending along an outer sidewall of the second gate spacer and an upper surface of the second field insulation layer,
wherein the first insulation liner is in contact with the first liner, and
wherein the second insulation liner is not in contact with the second liner.

18. The semiconductor device of claim 15,
wherein the first region is a PMOS region, and
wherein the second region is a NMOS region.

* * * * *